US010505115B2

(12) United States Patent
Li et al.

(10) Patent No.: US 10,505,115 B2
(45) Date of Patent: Dec. 10, 2019

(54) QUANTUM DOT LIGHT EMITTING DIODE SUBPIXEL ARRAY, METHOD FOR MANUFACTURING THE SAME, AND DISPLAY DEVICE

(71) Applicant: BOE TECHNOLOGY GROUP CO., LTD., Beijing (CN)

(72) Inventors: Yanzhao Li, Beijing (CN); Boris Kristal, Beijing (CN); Chieh Hsing Chung, Beijing (CN); Long Wang, Beijing (CN); Zhuo Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 250 days.

(21) Appl. No.: 15/525,493

(22) PCT Filed: Sep. 20, 2016

(86) PCT No.: PCT/CN2016/099485
§ 371 (c)(1),
(2) Date: May 9, 2017

(87) PCT Pub. No.: WO2017/128737
PCT Pub. Date: Aug. 3, 2017

(65) Prior Publication Data
US 2018/0108841 A1  Apr. 19, 2018

(30) Foreign Application Priority Data

Jan. 26, 2016 (CN) .......................... 2016 1 0050885

(51) Int. Cl.
*H01L 51/00* (2006.01)
*H01L 51/56* (2006.01)
(Continued)

(52) U.S. Cl.
CPC ...... *H01L 51/0015* (2013.01); *H01L 51/0027* (2013.01); *H01L 51/502* (2013.01);
(Continued)

(58) Field of Classification Search
CPC ....................................................... H01L 51/00
See application file for complete search history.

(56) References Cited

U.S. PATENT DOCUMENTS

2007/0215856 A1   9/2007  Kwon et al.
2008/0182072 A1   7/2008  Choi et al.
(Continued)

FOREIGN PATENT DOCUMENTS

CN   102983230 A   3/2013
CN   103764385 A   4/2014
(Continued)

OTHER PUBLICATIONS

Office Action from Korean Application No. 10-2017-7013795 dated Mar. 29, 2019 (7 pages).
(Continued)

*Primary Examiner* — Marvin Payen
(74) *Attorney, Agent, or Firm* — Harness, Dickey & Pierce, P.L.C.

(57) ABSTRACT

Embodiments of the present disclosure relate to a quantum dot light emitting diode subpixel array, a method for manufacturing the same, and a display device. The method for manufacturing the quantum dot light emitting diode subpixel array according to embodiments of the present disclosure comprises a quantum dot accepting layer forming step of forming a quantum dot accepting layer on a substrate; a thermosensitive quantum dot material layer applying step of applying a thermosensitive quantum dot material layer containing a thermosensitive organic ligand on the quantum dot accepting layer; and a thermosensitive quantum dot material (Continued)

Figure 1A:
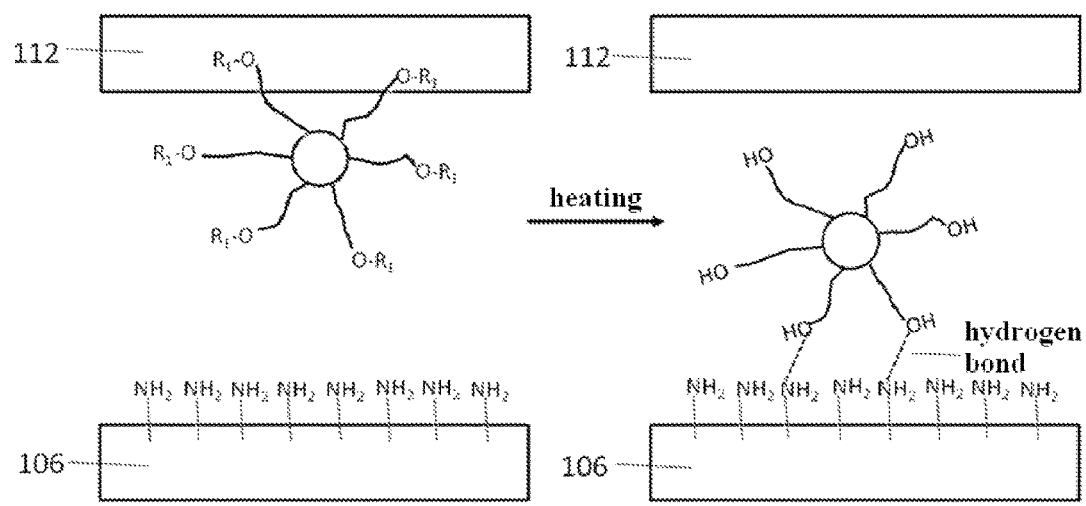

transferring step of subjecting the organic ligand of the thermosensitive quantum dot material in a predetermined area of the thermosensitive quantum dot material layer to a chemical reaction by heating such that the thermosensitive quantum dot material in the predetermined area is transferred onto a corresponding subpixel region on the quantum dot accepting layer.

20 Claims, 10 Drawing Sheets

(51) Int. Cl.
 *H01L 51/50* (2006.01)
 *H01L 27/32* (2006.01)
(52) U.S. Cl.
 CPC .......... *H01L 51/56* (2013.01); *H01L 27/3211* (2013.01); *H01L 51/0035* (2013.01); *H01L 51/0037* (2013.01); *H01L 51/0039* (2013.01); *H01L 51/0077* (2013.01); *H01L 51/5056* (2013.01); *H01L 51/5072* (2013.01)

(56) References Cited

U.S. PATENT DOCUMENTS

| | | |
|---|---|---|
| 2010/0239794 A1 | 9/2010 | Andrews et al. |
| 2013/0056705 A1 | 3/2013 | Kim et al. |
| 2015/0075397 A1 | 3/2015 | Gresty et al. |

FOREIGN PATENT DOCUMENTS

| | | |
|---|---|---|
| CN | 105070849 A | 11/2015 |
| CN | 105514302 A | 4/2016 |
| EP | 2221355 A1 | 8/2010 |
| EP | 2568337 A2 | 3/2013 |
| EP | 2862707 A1 | 4/2015 |
| GB | 2520384 A | 5/2015 |
| JP | 2010505640 A | 2/2010 |
| JP | 201356412 A | 3/2013 |
| KR | 100807561 B1 * | 3/2008 |
| KR | 100825176 B1 | 4/2008 |
| KR | 20080062907 A | 7/2008 |
| KR | 20100093858 A | 8/2010 |
| KR | 20120048772 A | 5/2012 |
| WO | WO-2008023716 A1 | 2/2008 |

OTHER PUBLICATIONS

T.H. Kim, K.S. Cho, et al., "Full-colour quantum dot displays fabricated by transfer printing," Feb. 20, 2011 (7 pages).
Written Opinion of the International Searching Authoirty from corresponding PCT Application No. PCT/CN2016/099485, dated Dec. 22, 2016 (5 pages).
Office Action from corresponding Chinese Application No. 201610050885.5, dated Jan. 25, 2017 (6 pages).
Extended European Search Report from European Application No. 16861091.3 dated Jul. 5, 2019, 8 pages.
Choi et al., "Transfer-printing of colloidal quantum dots for full-color light-emitting displays", 2012, 6 pages.
Office Action from Japanese Application No. 2017525346 dated Jun. 28, 2019, 3 pages.

* cited by examiner

QUANTUM DOT LIGHT EMITTING DIODE SUBPIXEL ARRAY, METHOD FOR MANUFACTURING THE SAME, AND DISPLAY DEVICE

CROSS REFERENCE TO RELATED APPLICATION

The present application claims priority to Chinese patent application No. 201610050885.5 filed on Jan. 26, 2016, the entirety of which is incorporated by reference herein.

FIELD

Embodiments of the present disclosure relate to a quantum dot light emitting diode subpixel array, a method for manufacturing the same, and a display device.

BACKGROUND

Active matrix organic light emitting diode (AMOLED) has once been widely recognized as a next generation display product that is expected to replace liquid crystal display (LCD). However, with the improvement of consumer's consumption level, the development of the display product tends to focus on high-resolution products. High-resolution AMOLED product is less competitive as compared to LCD because the structure of the organic layer of an organic light emitting display product is usually prepared by using a mask evaporation method, which has the defects of being hard to be aligned, low yield, being not capable of emitting light in smaller area, and etc. The problem of lacking of ability to control the evaporation area precisely makes it impossible to meet the demand for rapid development of high-resolution display. Although the mask evaporation process may be substituted by printing process to prepare the organic light emitting layer, the resolution that can be achieved by the latter is also extremely limited. Therefore, high-resolution AMOLED products face serious problems such as high technical difficulty, low yield, and high commodity price.

On the other hand, with the further development of quantum dot technology, the study on electric quantum dot light-emitting diode in which quantum dot material is used as the light emitting layer is getting increasingly deeper. As a result, quantum efficiency is increasingly improved to an extent that substantially meets the requirement of industrialization. It has been a trend in the future to further use new technology and process to achieve the industrialization of quantum dot light-emitting diode.

SUMMARY

Embodiments of the present disclosure provide a method for manufacturing a quantum dot light emitting diode (QD-LED) subpixel array, a quantum dot light emitting diode subpixel array manufactured by using the method and a display device comprising the subpixel array. The embodiments of the present disclosure not only bypass the difficulty encountered in the process of producing QD-LED subpixel by using printing with solution but also dramatically reduce the difficulty in producing high-resolution active matrix quantum dot light emitting diode (AM-QD-LED), which makes the cost of the AM-QD-LED technology substantially lower than that of the AMOLED technology and thus makes it possible for the AM-QD-LED technology to compete with existing LCD products on price.

According to a first aspect of the embodiments of the present disclosure, a method for manufacturing a quantum dot light emitting diode subpixel array is provided which comprises:

a quantum dot accepting layer forming step of forming a quantum dot accepting layer on a substrate;

a thermosensitive quantum dot material layer applying step of applying a thermosensitive quantum dot material layer containing a thermosensitive organic ligand on the quantum dot accepting layer; and a thermosensitive quantum dot material transferring step of subjecting the organic ligand of thermosensitive quantum dot material in a predetermined area of the thermosensitive quantum dot material layer to a chemical reaction by heating such that the thermosensitive quantum dot material in the predetermined area is transferred onto a corresponding subpixel region on the quantum dot accepting layer.

According to an exemplary embodiment of the present disclosure, the method may further comprise, after the thermosensitive quantum dot material transferring step, a step of removing unreacted thermosensitive quantum dot material remaining in the thermosensitive quantum dot material layer.

According to an exemplary embodiment of the present disclosure, the thermosensitive quantum dot material layer applying step may comprise a step of placing a carrier substrate with the thermosensitive quantum dot material layer formed thereon on the quantum dot accepting layer in an alignment position, with the thermosensitive quantum dot material layer facing the quantum dot accepting layer.

According to an exemplary embodiment of the present disclosure, the method may further comprise, after the thermosensitive quantum dot material transferring step, a step of moving away the carrier substrate.

According to an exemplary embodiment of the present disclosure, the thermosensitive quantum dot material layer applying step may comprise a step of placing a thermal conductive mask plate with the thermosensitive quantum dot material layer formed thereon on the quantum dot accepting layer in an alignment position, with the thermosensitive quantum dot material layer facing the quantum dot accepting layer.

According to an exemplary embodiment of the present disclosure, the method may further comprise, after the thermosensitive quantum dot material transferring step, a step of moving away the thermal conductive mask plate.

According to an exemplary embodiment of the present disclosure, the thermosensitive quantum dot material layer applying step may comprise a step of coating the thermosensitive quantum dot material layer on the quantum dot accepting layer.

According to an exemplary embodiment of the present disclosure, the method may further comprise, after the thermosensitive quantum dot material transferring step, a step of washing away unreacted thermosensitive quantum dot material remaining in the thermosensitive quantum dot material layer by using a rinsing process.

According to an exemplary embodiment of the present disclosure, the heating may comprise one or more of heating by laser light, heating by an infrared light source or heating by an oven.

According to an exemplary embodiment of the present disclosure, the thermosensitive quantum dot material transferring step may comprise a step of placing a thermal conductive mask plate on the thermosensitive quantum dot material layer in an alignment position before heating and then heating the thermal conductive mask plate.

According to an exemplary embodiment of the present disclosure, the heating may comprise periodically scanning the thermosensitive quantum dot material layer by using laser light.

According to an exemplary embodiment of the present disclosure, the heating may comprise heating the substrate as a whole and periodically scanning the thermosensitive quantum dot material layer by using laser light.

According to an exemplary embodiment of the present disclosure, the heating may further comprise heating the substrate as a whole.

According to an exemplary embodiment of the present disclosure, a hole transport layer or an electron transport layer between the thermosensitive quantum dot material layer and the substrate may be used as the quantum dot accepting layer.

According to an exemplary embodiment of the present disclosure, the organic ligand in the thermosensitive quantum dot material may comprise a group susceptible to thermal decomposition to produce amino group, hydroxyl group, carboxyl group or phenolic hydroxyl group.

According to an exemplary embodiment of the present disclosure, the quantum dot accepting layer may be a polymer layer containing amino group, pyridyl group, carboxyl group or hydroxyl group.

According to an exemplary embodiment of the present disclosure, the organic ligand in the thermosensitive quantum dot material layer may contain 1,3-butadienyl group and the quantum dot accepting layer may contain alkenyl group; or the organic ligand in the thermosensitive quantum dot material layer may contain alkenyl group and the quantum dot accepting layer may contain 1, 3-butadienyl group.

According to an exemplary embodiment of the present disclosure, the thermal conductive mask plate may be formed from oil soluble material.

According to an exemplary embodiment of the present disclosure, the carrier substrate for the thermosensitive quantum dot material layer may be formed from oil soluble material.

According to an exemplary embodiment of the present disclosure, the method may be used to form two or more thermosensitive quantum dot materials on respective subpixel regions, and the method may comprise, after the quantum dot accepting layer forming step, performing the thermosensitive quantum dot material layer applying step and the thermosensitive quantum dot material transferring step for each thermosensitive quantum dot material of the two or more thermosensitive quantum dot materials.

According to an exemplary embodiment of the present disclosure, the thermosensitive quantum dot material layer formed on the carrier substrate may be a stack of two or more thermosensitive quantum dot material layers, a first layer in the stack that is farthest from the carrier substrate is a thermosensitive quantum dot material layer having the lowest phase transition temperature, and a layer in the stack that is nearest to the carrier substrate is a thermosensitive quantum dot material layer having the highest phase transition temperature, and the thermosensitive quantum dot material transferring step may comprise:

heating the predetermined area of the stack at a first temperature so that a portion of the first layer in the stack that is in the predetermined area is transferred onto a first subpixel region on the quantum dot accepting layer and a portion of a second layer adjacent to the first layer in the stack that is in the predetermined area is exposed;

moving the carrier substrate by a distance of one subpixel unit such that the exposed portion of the second layer in the stack that is in the predetermined area is aligned with a second subpixel region, and heating the predetermined area at a second temperature higher than the first temperature such that the exposed portion of the second layer is transferred onto a second subpixel region on the quantum dot accepting layer, and transferring all layers in the stack in the predetermined area onto respective subpixel regions on the quantum dot accepting layer by using gradually increased temperatures in this way.

According to an exemplary embodiment of the present disclosure, the thermosensitive quantum dot material layer formed on the thermal conductive mask plate may be a stack of two or more thermosensitive quantum dot material layers, a first layer in the stack that is farthest from the thermal conductive mask plate is a thermosensitive quantum dot material layer having the lowest phase transition temperature, and a layer in the stack that is nearest to the thermal conductive mask plate is a thermosensitive quantum dot material layer having the highest phase transition temperature, and the thermosensitive quantum dot material transferring step may comprise:

heating the predetermined area of the stack at a first temperature so that a portion of the first layer in the stack that is in the predetermined area is transferred onto a first subpixel region on the quantum dot accepting layer and a portion of a second layer adjacent to the first layer in the stack that is in the predetermined area is exposed;

moving the thermal conductive mask plate by a distance of one subpixel unit such that the exposed portion of the second layer in the stack that is in the predetermined area is aligned with a second subpixel region, and heating the predetermined area at a second temperature higher than the first temperature such that the exposed portion of the second layer is transferred onto a second subpixel region on the quantum dot accepting layer, and transferring all layers in the stack in the predetermined area onto respective subpixel regions on the quantum dot accepting layer by using gradually increased temperatures in this way.

According to an exemplary embodiment of the present disclosure, the two or more thermosensitive quantum dot material layers may be layers of thermosensitive quantum dot materials for different subpixel regions of RGB pixel layout or RGBW pixel layout.

According to an exemplary embodiment of the present disclosure, the two or more thermosensitive quantum dot material layers may be layers of thermosensitive quantum dot materials for different subpixel regions with different subpixel areas in RGB pixel layout or RGBW pixel layout According to an exemplary embodiment of the present disclosure, at least one or all of the subpixel regions of the quantum dot light emitting diode are formed from thermosensitive quantum dot material, and the remaining subpixel regions are formed from organic light emitting material.

According to a second aspect of the embodiments of the present disclosure, a quantum dot light emitting diode subpixel array manufactured by using any one of the methods described above is provided.

According to a third aspect of the embodiments of the present disclosure, a display device comprising the quantum dot light emitting diode subpixel array described above is provided.

Subpixels such as red, green and blue subpixels are formed from thermosensitive quantum dot material on a quantum dot accepting layer by using heating process in the embodiments of the present disclosure, which avoids the technical difficulties in improving resolution encountered by organic light emitting diodes (OLED), such as further reduction of line width of the evaporation mask plate for OLED, requirement on print nozzle with higher precision, or the like. The embodiments of the present disclosure may facilitate the efficient production of high-resolution active matrix quantum dot light emitting diodes (AM-QD-LED) and the preparation in the process, improve the yield, and dramatically improve utilization rate of the quantum dot material, which pave the way for large-scale industrialization of the AM-QD-LED.

DRAWINGS

In order to illustrate the technical solutions of the embodiments of the present disclosure more clearly, brief description to the accompanying drawings of the embodiments will be provided hereinafter. Obviously, the drawings described in the following involve only some of the embodiments of the present disclosure and are not limitation to the present disclosure.

Figure 1B:
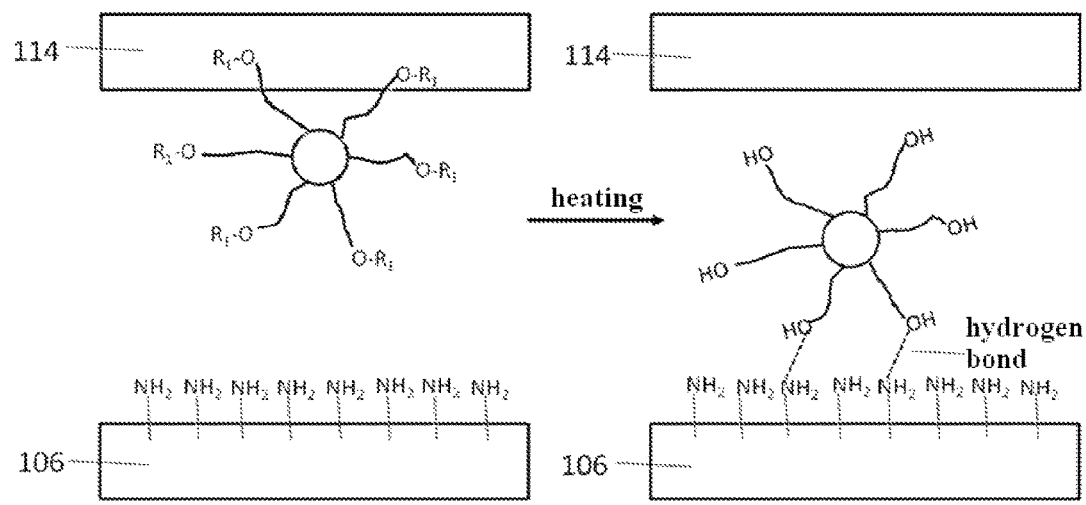
Figure 1C:
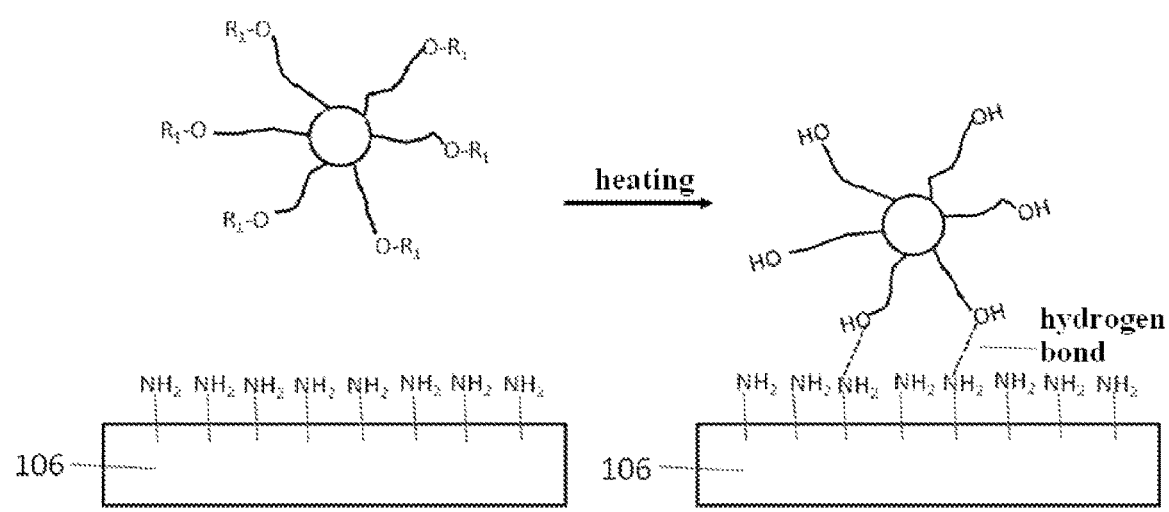

FIGS. 1A-1C exemplarily illustrate in sectional views the principle of transferring the organic ligand in the thermosensitive quantum dot material onto the quantum dot accepting layer due to heating according to embodiments of the present disclosure;

FIGS. 2A-2K schematically illustrate in exemplary sectional views individual stages of the method for manufacturing a quantum dot light emitting diode subpixel array according to a first embodiment of the present disclosure;

FIGS. 3A-3H schematically illustrate in exemplary sectional views individual stages of the method for manufacturing a quantum dot light emitting diode subpixel array according to a second embodiment of the present disclosure;

FIGS. 4A-4H schematically illustrate in exemplary sectional views individual stages of the method for manufacturing a quantum dot light emitting diode subpixel array according to a third embodiment of the present disclosure;

FIGS. 5A-5G schematically illustrate in exemplary sectional views individual stages of the method for manufacturing a quantum dot light emitting diode subpixel array according to a fourth embodiment of the present disclosure, and FIGS. 6A-6F schematically illustrate in exemplary sectional views individual stages of the method for manufacturing a quantum dot light emitting diode subpixel array according to a fifth embodiment of the present disclosure.

DETAILED DESCRIPTION

To make the object, technical solutions and advantages of embodiments of the disclosure more apparent, the technical solutions of the embodiments of the disclosure will be described below clearly and completely in connection with the drawings. Apparently, the described embodiments are just part of rather than all of the embodiments of the disclosure. Based on the described embodiments, all other embodiments obtained by those skilled in the art without any inventive work are within protection scope of the disclosure.

In description of the disclosure, it should be noted that, orientation or positional relationship indicated by terms such as "up", "down", "top" and "bottom" are orientation or positional relationship shown based on the drawings. These terms are only for convenience of description and for simplifying description, and do not indicate or imply that the apparatus or element referred to must have particular orientation, being constructed or operated in particular orientation, thus, they should not be construed to be limitation on the present disclosure.

Furthermore, the phase "a plurality of" means two or more in the description of the present disclosure unless otherwise stated.

According to a first aspect of the embodiments of the present disclosure, a method for manufacturing a quantum dot light emitting diode (QD-LED) subpixel array is provided.

Specifically, the method for manufacturing a quantum dot light emitting diode (QD-LED) subpixel array according to the embodiments of the present disclosure comprises:

a quantum dot accepting layer forming step of forming a quantum dot accepting layer on a substrate;

a thermosensitive quantum dot material layer applying step of applying a thermosensitive quantum dot material layer containing a thermosensitive organic ligand on the quantum dot accepting layer; and a thermosensitive quantum dot material transferring step of subjecting the organic ligand of thermosensitive quantum dot material in a predetermined area of the thermosensitive quantum dot material layer to a chemical reaction by heating such that the thermosensitive quantum dot material in the predetermined area is transferred onto a corresponding subpixel region on the quantum dot accepting layer.

As described above, subpixels such as red subpixel, green subpixel, blue subpixel and etc. are formed on the quantum dot accepting layer by a heating process using the thermosensitive quantum dot material in the embodiments of the present disclosure. FIGS. 1A-1C illustrate the principle of transferring the organic ligand in the thermosensitive quantum dot material onto the quantum dot accepting layer due to heating according to embodiments of the present disclosure. A thermosensitive quantum dot material layer containing a thermosensitive organic ligand is applied on the quantum dot accepting layer 106. In some embodiments, the thermosensitive quantum dot material layer may be carried on a carrier substrate 112 (FIG. 1A). In some embodiments, the thermosensitive quantum dot material layer may be carried on a thermal conductive mask plate 114 (FIG. 1B). However, the carrier substrate 112 or the thermal conductive mask plate 114 is not necessary for the thermosensitive quantum dot material layer. In some embodiments, the thermosensitive quantum dot material layer may be coated on the quantum dot accepting layer 106 directly (FIG. 1C). Before being heated, the thermosensitive quantum dot material layer has excellent compatibility to the material of the optional carrier substrate 112 or the optional thermal conductive mask plate 114 and thus can adhere to the surface of the carrier substrate 112 or the thermal conductive mask plate 114 tightly. When the thermosensitive quantum dot material in a predetermined area of the thermosensitive quantum dot material layer is heated, the thermosensitive organic ligand contained therein is subjected to a chemical reaction, which makes the thermosensitive quantum dot material in the predetermined area not compatible to the carrier substrate 112 or the thermal conductive mask plate 114 and fall off from the surface of the carrier substrate 112 or the thermal conductive mask plate 114. Furthermore, the organic ligand contained in the thermosensitive quantum dot material in the predetermined area which has been subjected to the chemical reaction can form weak-force bond such as hydrogen bond with the surface functional group of the quantum dot accepting layer on the backplane of the QD-LED, such that the thermosensitive quantum dot material in the predetermined area is transferred onto the quantum dot accepting layer on the backplane of the QD-LED. In this way, the transferring of the thermosensitive quantum dot material in the predetermined area onto the quantum dot accepting layer (i.e., backplane of the QD-LED) directly or from the surface of the optional carrier substrate 12 or the optional thermal conductive mask plate 114 onto the quantum dot accepting layer (i.e., backplane of the QD-LED) is accomplished under the action of heating.

It is to be noted here that what are illustrated in FIGS. 1A-1C are only examples, and the group contained in the organic ligand of the thermosensitive quantum dot material layer and the functional group contained in the quantum dot accepting layer 106 are not limited to the —O—$R_1$ group or —$NH_2$ group illustrated in FIGS. 1A-1C. One skilled in the art may conceive of other thermosensitive quantum dot materials that can be transferred onto the quantum dot accepting layer through weak bond after undergoing a chemical reaction due to heating and corresponding material of the quantum dot accepting layer.

The method for manufacturing a quantum dot light emitting diode subpixel array according to embodiments of the present disclosure, the quantum dot light emitting diode subpixel array thus formed, and the display device comprising the quantum dot light emitting diode subpixel array will be described in conjunction with specific embodiments hereinafter. However, the disclosure is not limited to these specific embodiments.

First Embodiment

FIGS. 2A-2K schematically illustrate in exemplary sectional views individual stages of the method for manufacturing a quantum dot light emitting diode subpixel array according to a first embodiment of the present disclosure. In a specific example, for example, a green, a blue and a red quantum dot light emitting diode subpixel array may be prepared respectively on a substrate by using laser heating process.

Figure 2A:

First, FIG. 2A illustrates an initial structure of the present embodiment which is a base substrate 202. The material of the base substrate 202 is well known in the art and can be for example glass, quartz or the like. The base substrate 202 may be transparent or opaque. The base substrate 202 is rinsed by using a standard process.

Figure 2B:
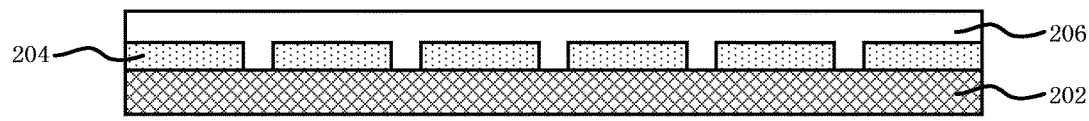

Then, an optional thin film transistor (TFT) array 204 may be formed on the base substrate 202 as shown in FIG. 2B. There is no limitation on the specific forming process or the structure of the TFT array, which can be any process or structure known in the art. For example, the TFT portion may be formed by the following steps of: depositing gate metal Mo of 200 nm and patterning it; depositing gate dielectric $SiO_2$ of 150 nm; depositing an active layer IGZO (indium gallium zinc oxide) of 40 nm and patterning it; depositing source/drain electrode metal Mo of 200 nm and patterning it; depositing a passivation layer $SiO_2$ of 300 nm and patterning it; depositing pixel electrode ITO (indium zinc oxide) of 40 nm and patterning it; depositing acrylic material by spin coating and performing photolithography process and curing process thereon so as to form a pixel defining layer with a thickness of about 1.5 um. In this way, a TFT backplane is formed. Of course, one skilled in the art may conceive of a conventional TFT backplane using other material, thickness or structure.

It is to be noted here that the TFT array 204 on the base substrate 202 is optional rather than necessary. It shall be understood by one skilled in the art that one or more optional circuit structures or device structures may be formed or not be formed on the base substrate 202 according to actual needs. The one or more optional circuit structures or device structures comprise but not limited to a TFT or an array thereof, and one skilled in the art may conceive of other circuit structures or device structures. In the present application, the base substrate itself or a combination of the base substrate and the optional circuit structures or device structures formed thereon are collectively called substrate.

Before forming the QD-LED portion, the back surface of the optional TFT backplane may be treated by plasma to adjust the work function of the pixel electrodes, such that the efficiency of the LED device can be higher and the life thereof can be longer. Furthermore, an optional first common layer may be formed by using for example evaporation, spin coating, sputtering or the like. In case that the anodes of the pixels are in the bottom layer, the first common layer may comprise a hole injection layer and a hole transport layer; while in case that the cathodes of the pixels are in the bottom layer, the first common layer may comprise an electron injection layer and an electron transport layer. For example, when the first common layer comprise the hole injection layer and the hole transport layer, PEDOT:PSS and TFB or the like may be spin coated respectively. When the first common layer comprise the electron injection layer and the electron transport layer, for example, LiF:Al may be evaporated and a ZnO layer may be spin coated or sputtered respectively, and etc. The total thickness of the first common layer may be for example 50-100 nm.

Then, as shown in FIG. 2B, a quantum dot accepting layer 206 containing a particular functional group may be applied (for example, spin coated) on the structure thus obtained. The particular functional group can form weak bond with thermosensitive quantum dot material in a predetermined area of the thermosensitive quantum dot material layer that will be described in the following when the thermosensitive quantum dot material is heated. For example, the functional group may be amino group, pyridyl group, carboxyl group, hydroxyl group or the like.

Figure 2C:
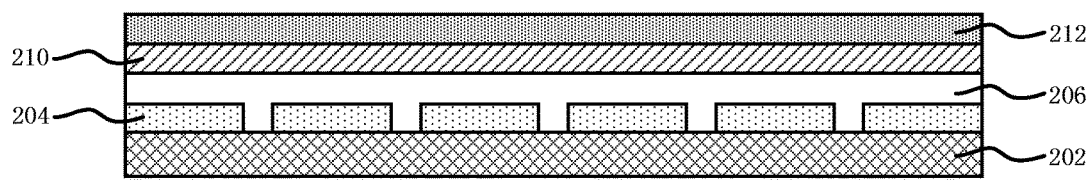

Next, as shown in FIG. 2C, a first thermosensitive quantum dot material layer 210 containing a thermosensitive organic ligand may be applied on the quantum dot accepting layer 206. In the present embodiment, the application of the first thermosensitive quantum dot material layer 201 may be performed by placing a first carrier substrate 212 with the first thermosensitive quantum dot material layer 210 formed thereon on the quantum dot accepting layer 206 in an alignment position, with the first thermosensitive quantum dot material layer 210 facing the quantum dot accepting layer 206. As described above, the first thermosensitive quantum dot material layer 210 has excellent compatibility with the first carrier substrate 212 and can adhere to the surface of the first carrier substrate 212 tightly before being heated.

Specifically, for example, the first thermosensitive quantum dot material layer 210 may comprise thermosensitive quantum dot material for green LED, which is only an example, and the embodiments of the present disclosure are not limited thereto.

Figure 2D:
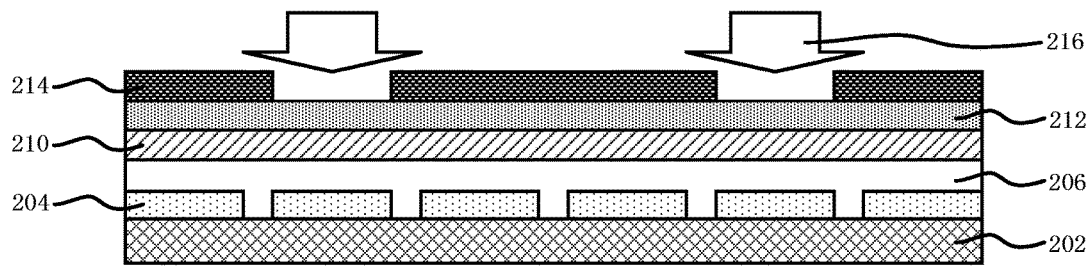

As shown in FIG. 2D, after applying the first thermosensitive quantum dot material layer 210, a first thermal conductive mask plate 214 is placed on the first carrier substrate 212 with the first thermosensitive quantum dot material layer 210 provided thereon, such that a portion of the first thermal conductive mask plate 214 that is not covered by masking material are aligned with a first subpixel region onto which the first thermosensitive quantum dot material layer 210 will be transferred during a subsequent heating process. Also, the first thermal conductive mask plate 214 is heated by using laser light 216, as shown in FIG. 2D. Therefore, the first thermosensitive quantum dot material of the first thermosensitive quantum dot material layer 210 that is in the area not masked by the masking material is heated such that the organic ligand therein is subjected to a chemical reaction, and becomes not compatible with the first carrier substrate 212 which it was once compatible with and falls off from the first carrier substrate 212. On the other hand, the organic ligand in the first thermosensitive quantum dot material that has been subjected to the chemical reaction after being irradiated by the laser light can form weak bond with the surface functional group of the quantum dot accepting layer 206, and is transferred onto the quantum dot accepting layer 206.

Figure 2E:
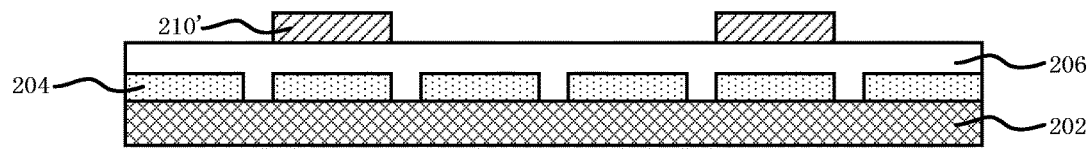

Therefore, the first thermosensitive quantum dot material 210' of the first thermosensitive quantum dot material layer 210 that is in the area irradiated by the laser light enters into a corresponding first subpixel region, as shown in FIG. 2E. Then, the remaining first thermosensitive quantum dot material in the area not irradiated by the laser light is removed together with the first carrier substrate 212, with only the first thermosensitive quantum dot material 210' being left in the first subpixel region (specifically, may be a green subpixel region).

Figure 2F:
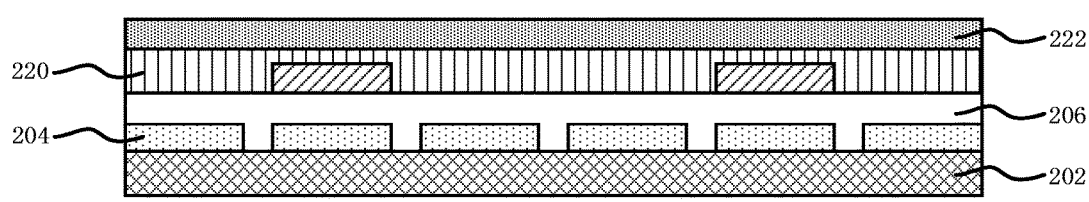

Next, as shown in FIG. 2F, a second thermosensitive quantum dot material layer 220 containing a thermosensitive organic ligand is applied on the quantum dot accepting layer 206 with the first thermosensitive quantum dot material 210' formed thereon. In the present embodiment, the application of the second thermosensitive quantum dot material layer 220 is performed by placing a second carrier substrate 222 with the second thermosensitive quantum dot material layer 220 formed thereon on the quantum dot accepting layer 206 in an alignment position, with the second thermosensitive quantum dot material layer 220 facing the quantum dot accepting layer 206. As described above, the second thermosensitive quantum dot material layer 220 has excellent compatibility with the second carrier substrate 222 and can adhere to the surface of the latter tightly before being heated.

Specifically, for example, the second thermosensitive quantum dot material layer 220 may comprise thermosensitive quantum dot material for blue LED, which is only an example, and the embodiments of the present disclosure are not limited thereto.

Figure 2G:
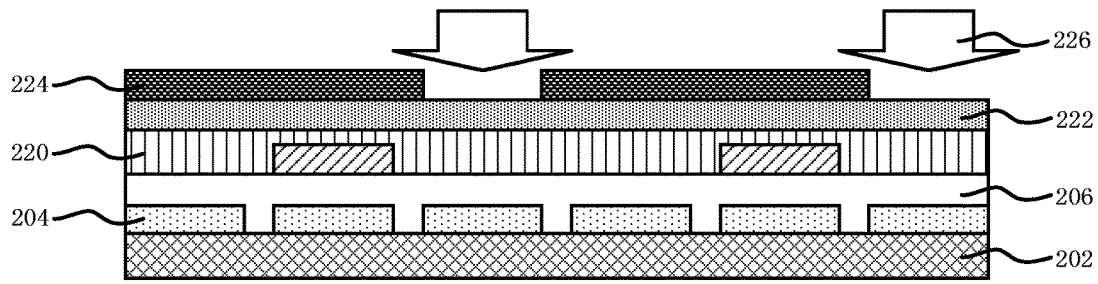

As shown in FIG. 2G, after applying the second thermosensitive quantum dot material layer 220, a second thermal conductive mask plate 214 is placed on the second carrier substrate 222 with the second thermosensitive quantum dot material layer 220 formed thereon, such that a portion of the second thermal conductive mask plate 224 that is not covered by masking material is aligned with a second subpixel region onto which the second thermosensitive quantum dot material layer 220 will be transferred during a subsequent heating process. Also, the second thermal conductive mask plate 224 is heated by using laser light 226, as shown in FIG. 2G. Therefore, the thermosensitive quantum dot material of the second thermosensitive quantum dot material layer 220 that is in the area not masked by the masking material is heated such that the organic ligand therein is subjected to a chemical reaction, and becomes not compatible with the second carrier substrate 222 which it was once compatible with and falls off from the second carrier substrate 222. On the other hand, the organic ligand in the second thermosensitive quantum dot material that has been subjected to the chemical reaction after being irradiated by the laser light can form weak bond with the surface functional group of the quantum dot accepting layer 206, and is transferred onto the quantum dot accepting layer 206.

Figure 2H:
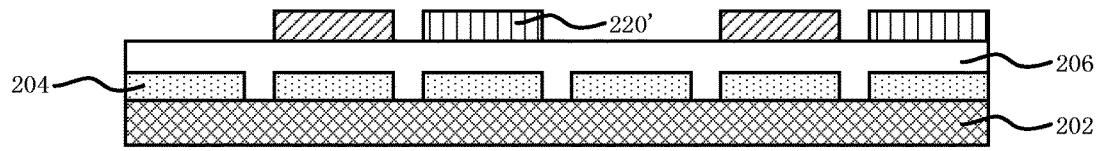

Therefore, the second thermosensitive quantum dot material 220' of the second thermosensitive quantum dot material layer 220 that is in the area irradiated by the laser light enters into a corresponding second subpixel region, as shown in FIG. 2H. Then, the remaining second thermosensitive quantum dot material in the area not irradiated by the laser light is removed together with the second carrier substrate 222, with only the second thermosensitive quantum dot material 220' being left in the second subpixel region (specifically, may be a blue subpixel region).

Figure 2I:
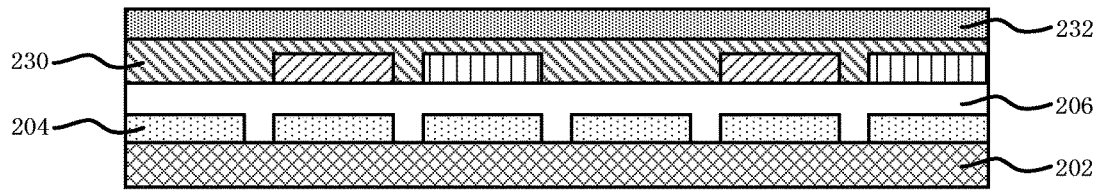

Next, as shown in FIG. 2I, a third thermosensitive quantum dot material layer 230 containing a thermosensitive organic ligand is applied on the quantum dot accepting layer 206 with the first thermosensitive quantum dot material 210' and the second thermosensitive quantum dot material 220' formed thereon. In the present embodiment, the application of the third thermosensitive quantum dot material layer 230 is performed by placing a third carrier substrate 232 with the third thermosensitive quantum dot material layer 230 formed thereon on the quantum dot accepting layer 206 in an alignment position, with the third thermosensitive quantum dot material layer 230 facing the quantum dot accepting layer 206. As described above, the third thermosensitive quantum dot material layer 230 has excellent compatibility with the third carrier substrate 232 and can adhere to the surface of the latter tightly before being heated.

Specifically, for example, the third thermosensitive quantum dot material layer 230 may comprise thermosensitive quantum dot material for red LED, which is only an example, and the embodiments of the present disclosure are not limited thereto.

Figure 2J:
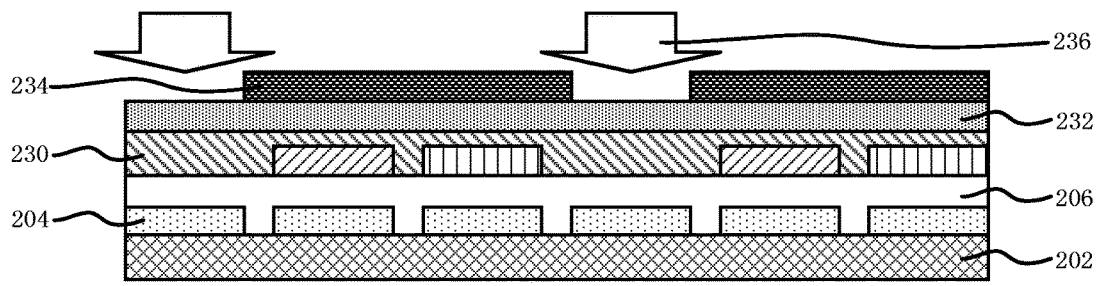

As shown in FIG. 2J, after applying the third thermosensitive quantum dot material layer 230, a third thermal conductive mask plate 234 is placed on the third carrier substrate 232 with the third thermosensitive quantum dot material layer 230 formed thereon, such that a portion of the third thermal conductive mask plate 234 that is not covered by masking material is aligned with a third subpixel region onto which the third thermosensitive quantum dot material layer 230 will be transferred during a subsequent heating process. Also, the third thermal conductive mask plate 234 is heated by using laser light 236, as shown in FIG. 2J. Therefore, the thermosensitive quantum dot material of the third thermosensitive quantum dot material layer 230 that is in the area not masked by the masking material is heated such that the organic ligand therein is subjected to a chemical reaction, and becomes not compatible with the third carrier substrate 232 which it was once compatible with and falls off from the third carrier substrate 232. On the other hand, the organic ligand in the third thermosensitive quantum dot material that has been subjected to the chemical reaction after being irradiated by the laser light can form weak bond with the surface functional group of the quantum dot accepting layer 206, and is transferred onto the quantum dot accepting layer 206.

Figure 2K:
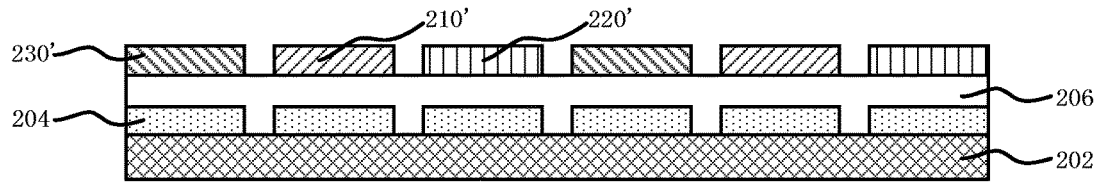

Therefore, the third thermosensitive quantum dot material 230' of the third thermosensitive quantum dot material layer 230 that is in the area irradiated by the laser light enters into a corresponding third subpixel region, as shown in FIG. 2K. Then, the remaining third thermosensitive quantum dot material 230' in the area not irradiated by the laser light is removed together with the third carrier substrate 232, with only the third thermosensitive quantum dot material 230' being left in the third subpixel region (specifically, may be a red subpixel region).

In this way, an array of the first thermosensitive quantum dot material 210', an array of the second thermosensitive quantum dot material 220' and an array of the third thermosensitive quantum dot material 230'(specifically, may be a green subpixel array, a blue subpixel array and a red subpixel array, respectively) may be formed respectively in the first, second and third subpixel regions of the substrate by heating process.

Furthermore, after the formation of the subpixel arrays is completed, an optional second common layer may be formed thereon (for example, by spin coating, evaporating or the like). When the anodes of the pixels are in the bottom layer, the second common layer may comprise an electron transportation layer and an electron injection layer; whereas when the cathodes of the pixels are in the bottom layer, the second common layer may comprise a hole transportation layer and a hole injection layer. In case that the second common layer comprises the electron transportation layer and the electron injection layer, for example, ZnO nanoparticles, LiF or the like may be spin coated or evaporated; whereas in case that the second common layer comprises the hole transportation layer and the hole injection layer, for example, TFB, PEDOT:PSS or the like may be spin coated respectively.

Then, a thin metal layer for second electrodes may be formed (for example, by evaporation). For example, when the above pixel electrodes (the first electrodes) are anodes, the second electrodes are cathodes, or vice versa. The cathodes may be formed of, for example, a LiF:Al layer of about 500-1000 nm; the anodes may be formed of Al, Ag, Al/ITO or the like of about 30-100 nm. A Dam & Fritz (dam melting material packaging process) packaging and cutting is performed after the formation of the second electrodes, and a panel of a whole AM-QD-LED is finished so as to obtain a display device based on the AM-QD-LED.

Furthermore, a modification may be added to the respective function layers as required in above process. For example, an electron barrier layer and/or a hole barrier layer may be added as required; the hole injection layer and/or the electron injection layer or the like may be omitted as required; and the substrate may be additionally heated as a whole as required so as to facilitate the process.

The resolution of the AM-QD-LED device thus manufactured may be improved dramatically. For example, the minimum area of a subpixel of the device may be 10-30 μm or less, and thus the resolution can be about 300-800 ppi or higher.

As described above, the fact of forming subpixels such as red, green and blue subpixels directly from thermosensitive quantum dot material by using heating process according to the present embodiment may facilitate the efficient production of high-resolution active matrix quantum dot light emitting diodes and the preparation in the process, improve the yield, and dramatically improve the utilization rate of the quantum dot material.

Second Embodiment

A method similar to that of the first embodiment is adopted in the second embodiment to implement individually transferring the respective thermosensitive quantum dot materials onto their corresponding subpixel regions. The second embodiment is different from the first embodiment in that the thermosensitive quantum dot materials are carried on a thermal conductive mask plate directly rather than using the carrier substrates for the thermosensitive quantum dot material layers. In the following description, contents of the second embodiment that are similar to those of the first embodiment will not be described in detail.

FIGS. 3A-3H schematically illustrate in exemplary sectional views individual stages of the method for manufacturing a quantum dot light emitting diode subpixel array according to a second embodiment of the present disclosure.

Figure 3A:
Figure 3B:
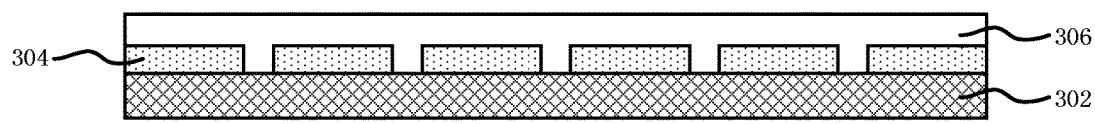

As shown in FIGS. 3A and 3B, an optional TFT array 304 may be formed on a rinsed base substrate 302, and a quantum dot accepting layer 306 may be formed on the optional TFT array 304, which are same as the steps shown in FIGS. 2A and 2B in the first embodiment.

Figure 3C:
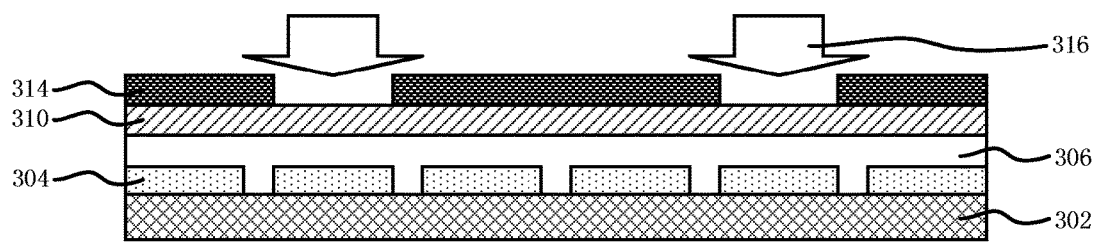

Then, a first thermosensitive quantum dot material layer 310 containing a thermosensitive organic ligand is applied on the quantum dot accepting layer 306, as shown in FIG. 3C. In the present embodiment, the application of the first thermosensitive quantum dot material layer 310 is performed by placing a first thermal conductive mask plate 314 with the first thermosensitive quantum dot material layer 310 provided thereon on the quantum dot accepting layer 306 in an alignment position such that the first thermosensitive quantum dot material layer 310 faces the quantum dot accepting layer 306 and a portion of the first thermal conductive mask plate 314 that is not covered by masking material is aligned with a first subpixel region onto which the first thermosensitive quantum dot material layer 310 will be transferred during a subsequent heating process. The first thermosensitive quantum dot material layer 310 has excellent compatibility with the thermal conductive mask plate 314 and can adhere to the surface of the thermal conductive mask plate 314 tightly before being heated.

Specifically, for example, the first thermosensitive quantum dot material layer 310 may comprise thermosensitive quantum dot material for green LED, which is only an example, and the embodiments of the present disclosure are not limited thereto.

Figure 3D:
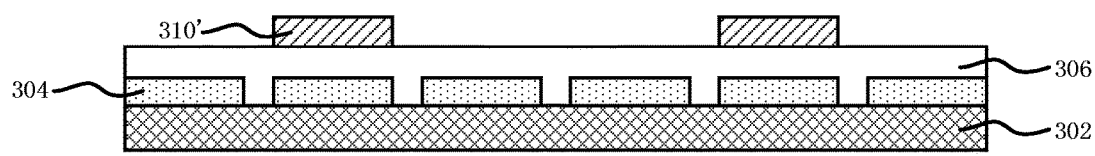

Next, the first thermal conductive mask plate 314 may be heated by laser light 316, as shown in FIG. 3C. Therefore, the first thermosensitive quantum dot material of the first thermosensitive quantum dot material layer 310 that is in the area not masked by the masking material is heated such that the organic ligand therein is subjected to a chemical reaction, and becomes not compatible with the first thermal conductive mask plate 314 which it was once compatible with and falls off from first thermal conductive mask plate 314. On the other hand, the organic ligand in the first thermosensitive quantum dot material that has been subjected to the chemical reaction after being irradiated by the laser light can form weak bond with the surface functional group of the quantum dot accepting layer 306, and is transferred onto the quantum dot accepting layer 306. Therefore, the first thermosensitive quantum dot material 310' of the first thermosensitive quantum dot material layer 310 that is in the area irradiated by the laser light enters into a corresponding first subpixel region, as shown in FIG. 3D. Then, the remaining first thermosensitive quantum dot material in the area not irradiated by the laser light is removed together with the first thermal conductive mask plate 314, with only the first thermosensitive quantum dot material 310' being left in the first subpixel region (specifically, may be a green subpixel region).

Figure 3E:
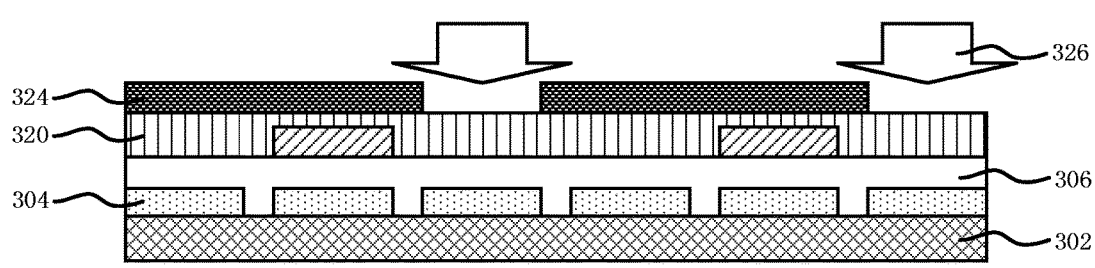

Next, as shown in FIG. 3E, a second thermosensitive quantum dot material layer 320 containing a thermosensitive organic ligand may be applied on the quantum dot accepting layer 306 with the first thermosensitive quantum dot material 310' formed thereon. In the present embodiment, the application of the second thermosensitive quantum dot material layer 320 is performed by placing a second thermal conductive mask plate 324 with the second thermosensitive quantum dot material layer 320 provided thereon on the quantum dot accepting layer 306 in an alignment position such that the second thermosensitive quantum dot material layer 320 faces the quantum dot accepting layer 306 and a portion of the second thermal conductive mask plate 324 that is not covered by masking material is aligned with a second subpixel region onto which the second thermosensitive quantum dot material layer 320 will be transferred during a subsequent heating process. The second thermosensitive quantum dot material layer 320 has excellent compatibility with the thermal conductive mask plate 324 and can adhere to the surface of the second thermal conductive mask plate 324 tightly before being heated.

Specifically, for example, the second thermosensitive quantum dot material layer 320 may comprise thermosensitive quantum dot material for blue LED, which is only an example, and the embodiments of the present disclosure are not limited thereto.

Next, the second thermal conductive mask plate 324 may be heated by laser light 326, as shown in FIG. 3E. Therefore, the second thermosensitive quantum dot material of the second thermosensitive quantum dot material layer 320 that is in the area not masked by the masking material is heated such that the organic ligand therein is subjected to a chemical reaction, and becomes not compatible with the second thermal conductive mask plate 324 which it was once compatible with and falls off from second thermal conductive mask plate 324. On the other hand, the organic ligand in the second thermosensitive quantum dot material that has been subjected to the chemical reaction after being irradiated by the laser light can form weak bond with the surface functional group of the quantum dot accepting layer 306, and is transferred onto the quantum dot accepting layer 306.

Figure 3F:
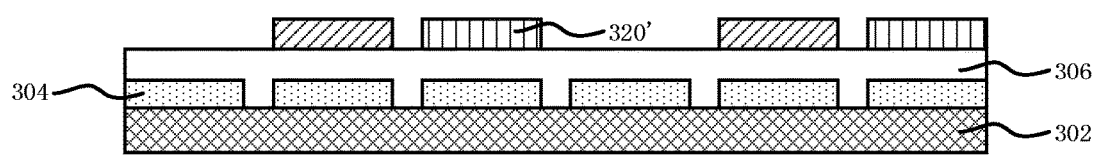

Therefore, the second thermosensitive quantum dot material 320' of the second thermosensitive quantum dot material layer 320 that is in the area irradiated by the laser light enters into a corresponding second subpixel region, as shown in FIG. 3F. Then, the remaining second thermosensitive quantum dot material in the area not irradiated by the laser light is removed together with the second thermal conductive mask plate 324, with only the second thermosensitive quantum dot material 320' being left in the second subpixel region (specifically, may be a blue subpixel region).

Figure 3G:
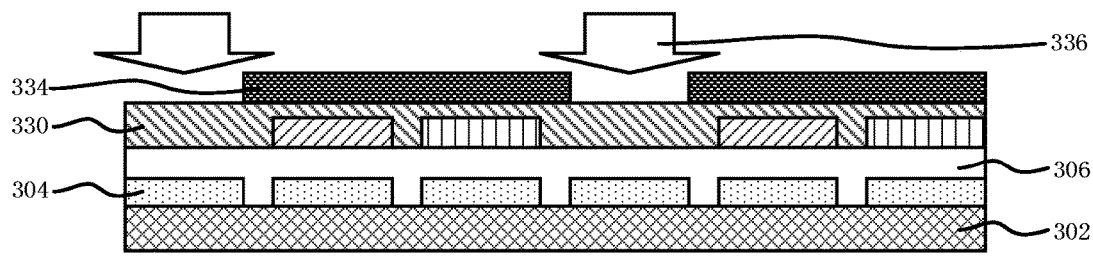

Next, as shown in FIG. 3G, a third thermosensitive quantum dot material layer 330 containing a thermosensitive organic ligand may be applied on the quantum dot accepting layer 306 with the first thermosensitive quantum dot material 310' and the second thermosensitive quantum dot material 320' formed thereon. In the present embodiment, the application of the third thermosensitive quantum dot material layer 330 is performed by placing a third thermal conductive mask plate 334 with the third thermosensitive quantum dot material layer 330 provided thereon on the quantum dot accepting layer 306 in an alignment position such that the third thermosensitive quantum dot material layer 330 faces the quantum dot accepting layer 306 and a portion of the third thermal conductive mask plate 334 that is not covered by masking material is aligned with a third subpixel region onto which the third thermosensitive quantum dot material layer 330 will be transferred during a subsequent heating process. The third thermosensitive quantum dot material layer 330 has excellent compatibility with the thermal conductive mask plate 334 and can adhere to the surface of the thermal conductive mask plate 334 tightly before being heated.

Specifically, for example, the third thermosensitive quantum dot material layer 330 may comprise thermosensitive quantum dot material for red LED, which is only an example, and the embodiments of the present disclosure are not limited thereto.

Next, the third thermal conductive mask plate 334 may be heated by laser light 336, as shown in FIG. 3G. Therefore, the third thermosensitive quantum dot material of the third thermosensitive quantum dot material layer 330 that is in the area not masked by the masking material is heated such that the organic ligand therein is subjected to a chemical reaction, and becomes not compatible with the third thermal conductive mask plate 334 which it was once compatible with and falls off from third thermal conductive mask plate 334. On the other hand, the organic ligand in the third thermosensitive quantum dot material 330 that has been subjected to the chemical reaction after being irradiated by the laser light can form weak bond with the surface functional group of the quantum dot accepting layer 306, and is transferred onto the quantum dot accepting layer 306.

Figure 3H:
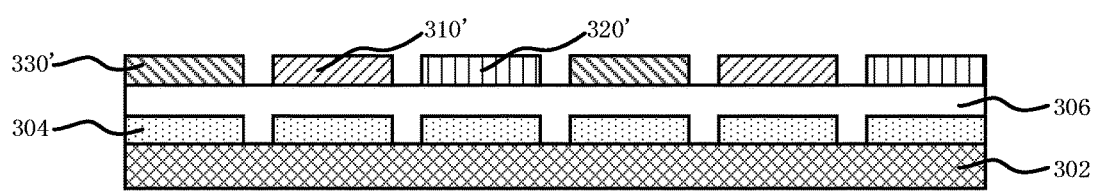

Therefore, the third thermosensitive quantum dot material 330' of the third thermosensitive quantum dot material layer 330 that is in the area irradiated by the laser light enters into a corresponding third subpixel region, as shown in FIG. 3H. Then, the remaining third thermosensitive quantum dot material in the area not irradiated by the laser light is removed together with the third thermal conductive mask plate 334, with only the third thermosensitive quantum dot material 330' being left in the third subpixel region (specifically, may be a red subpixel region).

In this way, an array of the first thermosensitive quantum dot material 310', an array of the second thermosensitive quantum dot material 320' and an array of the third thermosensitive quantum dot material 330' (specifically, may be a green subpixel array, a blue subpixel array and a red subpixel array, respectively) may be formed respectively in the first, second and third subpixel regions of the substrate by heating process.

Other steps and configurations after the formation of all the subpixel arrays in the present embodiment are same as those in the first embodiment and will not be repeated herein.

As described above, the fact of forming subpixels such as red, green and blue subpixels directly from thermosensitive quantum dot material by using heating process according to the present embodiment may facilitate the efficient production of high-resolution active matrix quantum dot light emitting diodes and the preparation in the process, improve the yield, and dramatically improve the utilization rate of the quantum dot material.

Third Embodiment

A heating method similar to that of the first embodiment is adopted in the third embodiment to implement individually transferring the respective thermosensitive quantum dot materials onto their corresponding subpixel regions. The third embodiment is different from the first embodiment mainly in that the thermosensitive quantum dot materials are coated on the quantum dot accepting layer directly rather than using the carrier substrates for the thermosensitive quantum dot material layers. In the following description, contents of the third embodiment that are similar to those of the first embodiment will not be described in detail.

FIGS. 4A-4H schematically illustrate in exemplary sectional views individual stages of the method for manufacturing a quantum dot light emitting diode subpixel array according to a third embodiment of the present disclosure.

Figure 4A:
Figure 4B:
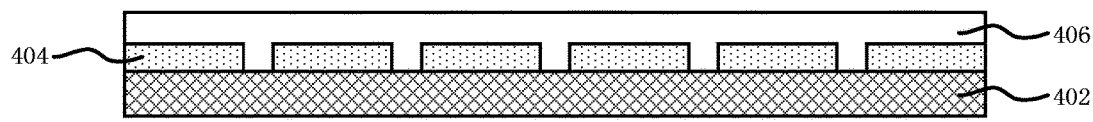

As shown in FIGS. 4A and 4B, an optional TFT array 404 may be formed on a rinsed base substrate 402, and a quantum dot accepting layer 406 may be formed on the optional TFT array 404, which are same as the steps shown in FIGS. 2A and 2B in the first embodiment.

Figure 4C:
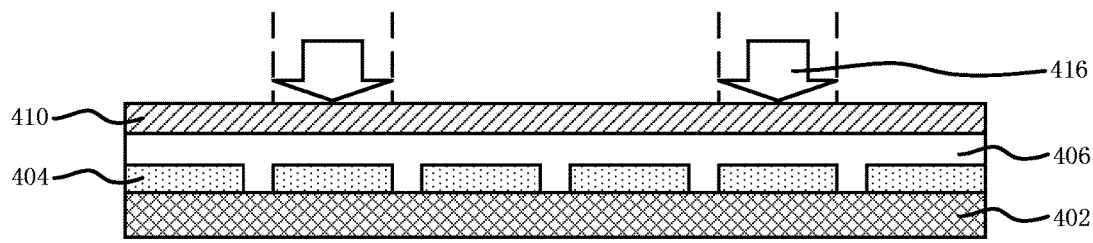

Then, a first thermosensitive quantum dot material layer 410 containing a thermosensitive organic ligand is applied on the quantum dot accepting layer 406, as shown in FIG. 4C. In the present embodiment, the application of the first thermosensitive quantum dot material layer 410 is performed by coating the first thermosensitive quantum dot material layer 410 on the quantum dot accepting layer 406 directly.

Specifically, for example, the first thermosensitive quantum dot material layer 410 may comprise thermosensitive quantum dot material for green LED, which is only an example, and the embodiments of the present disclosure are not limited thereto.

Next, a portion of the first thermosensitive quantum dot material layer 410 that is in the first subpixel region may be heated by periodically scanning with laser light 416 or by using a first thermal conductive mask plate for patterning as in the first embodiment, as shown in FIG. 4C. The organic ligand in the first thermosensitive quantum dot material that has been subjected to a chemical reaction in the portion of the first thermosensitive quantum dot material layer 410 that is heated can form weak bond with the surface functional group of the quantum dot accepting layer 406, and is transferred onto the quantum dot accepting layer 406.

Figure 4D:
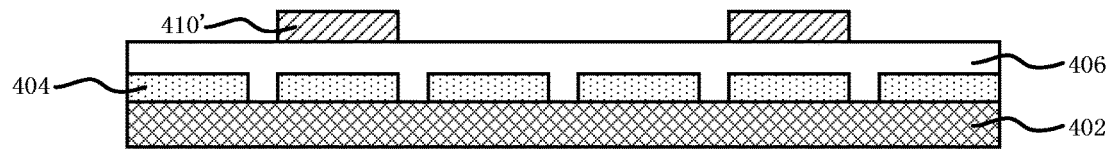

Therefore, the first thermosensitive quantum dot material 410' in the portion being heated enters into a corresponding first subpixel region, as shown in FIG. 4D. Then, the remaining first thermosensitive quantum dot material of first thermosensitive quantum dot material layer 410 that is in the portion that is not heated may be removed in a subsequent rinsing process because it does not form weak bond with the surface functional group of the quantum dot accepting layer 406. As a result, only the first thermosensitive quantum dot material 410' is left in the first subpixel region (specifically, may be a green subpixel region).

Figure 4E:
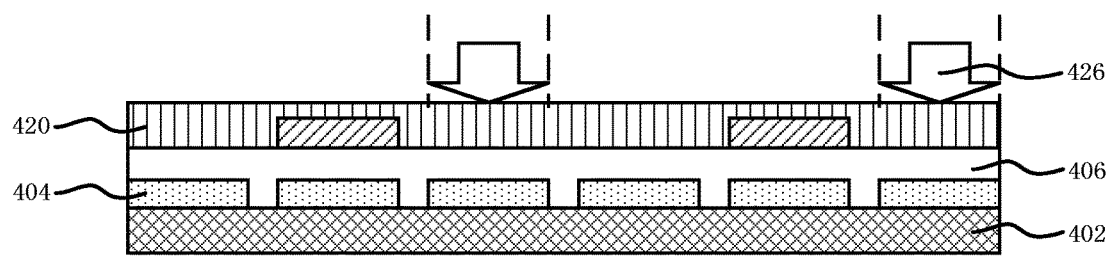

Then, a second thermosensitive quantum dot material layer 420 containing a thermosensitive organic ligand is applied on the quantum dot accepting layer 406 with the first thermosensitive quantum dot material layer 410' formed thereon, as shown in FIG. 4E. In the present embodiment, the application of the second thermosensitive quantum dot material layer 420 is performed by coating the second thermosensitive quantum dot material layer 420 on the quantum dot accepting layer 406 directly.

Specifically, for example, the second thermosensitive quantum dot material layer 420 may comprise thermosensitive quantum dot material for blue LED, which is only an example, and the embodiments of the present disclosure are not limited thereto.

Next, a portion of the second thermosensitive quantum dot material layer 420 that is in the second subpixel region may be heated through periodical scanning with laser light 426 or by using a second thermal conductive mask plate for patterning as in the first embodiment, as shown in FIG. 4E. The organic ligand in the second thermosensitive quantum dot material 420 that has been subjected to a chemical reaction in the portion of the first thermosensitive quantum dot material layer 410 that is heated can form weak bond with the surface functional group of the quantum dot accepting layer 406, and is transferred onto the quantum dot accepting layer 406.

Figure 4F:
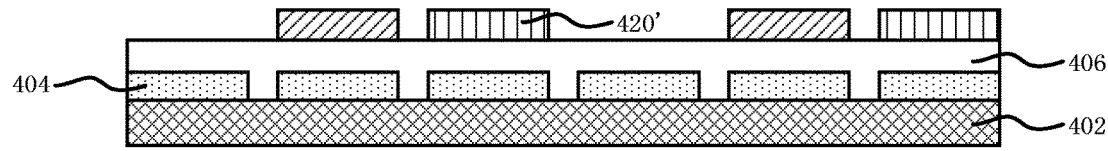

Therefore, the second thermosensitive quantum dot material 420' in the portion being heated enters into a corresponding second subpixel region, as shown in FIG. 4F. Then, the remaining second thermosensitive quantum dot material of the second thermosensitive quantum dot material layer 420 that is in the portion that is not heated may be removed in a subsequent rinsing process because it does not form weak bond with the surface functional group of the quantum dot accepting layer 406. As a result, only the second thermosensitive quantum dot material 420' is left in the second subpixel region (specifically, may be a blue subpixel region).

Figure 4G:
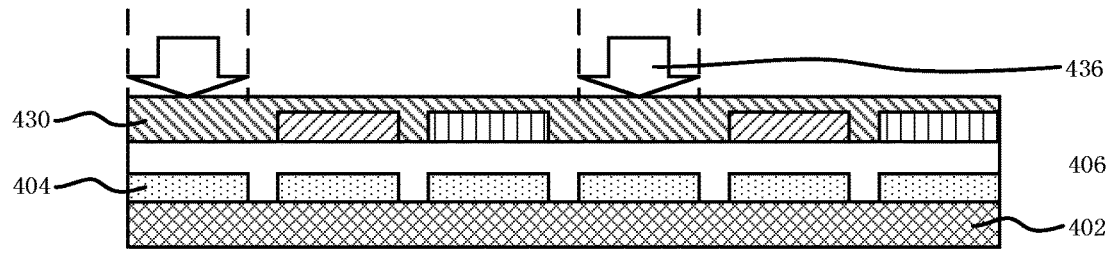

Then, a third thermosensitive quantum dot material layer 430 containing a thermosensitive organic ligand is applied on the quantum dot accepting layer 406 with the first thermosensitive quantum dot material layer 410' and the second thermosensitive quantum dot material layer 420' formed thereon, as shown in FIG. 4G. In the present embodiment, the application of the third thermosensitive quantum dot material layer 430 is performed by coating the third thermosensitive quantum dot material layer 430 on the quantum dot accepting layer 406 directly.

Specifically, for example, the third thermosensitive quantum dot material layer 430 may comprise thermosensitive quantum dot material for red LED, which is only an example, and the embodiments of the present disclosure are not limited thereto.

Next, a portion of the third thermosensitive quantum dot material layer 430 that is in the third subpixel region may be heated through periodical scanning with laser light 436 or by using a third thermal conductive mask plate for patterning as in the first embodiment, as shown in FIG. 4G. The organic ligand in the third thermosensitive quantum dot material 430 that has been subjected to a chemical reaction in the portion of the third thermosensitive quantum dot material layer 430 that is heated can form weak bond with the surface functional group of the quantum dot accepting layer 406, and is transferred onto the quantum dot accepting layer 406.

Figure 4H:
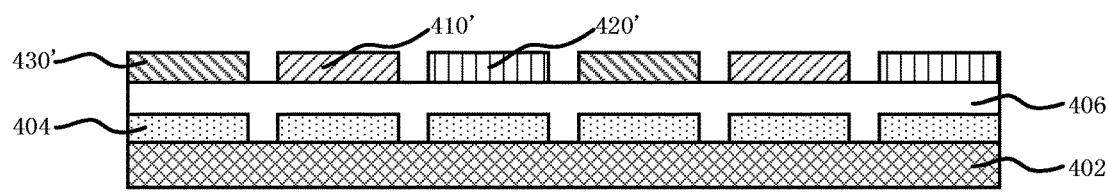

Therefore, the third thermosensitive quantum dot material 430' of the third thermosensitive quantum dot material layer 430 in the portion being heated enters into a corresponding third subpixel region, as shown in FIG. 4H. Then, the remaining third thermosensitive quantum dot material of the third thermosensitive quantum dot material layer 430 that is in the portion that is not heated may be removed in a subsequent rinsing process because it does not form weak bond with the surface functional group of the quantum dot accepting layer 406. As a result, only the third thermosensitive quantum dot material 430' is left in the third subpixel region (specifically, may be a red subpixel region).

In this way, an array of the first thermosensitive quantum dot material 410', an array of the second thermosensitive quantum dot material 420' and an array of the third thermosensitive quantum dot material 430' (specifically, may be a green subpixel array, a blue subpixel array and a red subpixel array, respectively) may be formed respectively in the first, second and third subpixel regions of the substrate by heating process.

Other steps and configurations after the formation of all the subpixel arrays in the present embodiment are same as those in the first embodiment and will not be repeated herein.

As described above, the fact of forming subpixels such as red, green and blue subpixels directly from thermosensitive quantum dot material by using heating process according to the present embodiment may facilitate the efficient production of high-resolution active matrix quantum dot light emitting diodes and the preparation in the process, improve the yield, and dramatically improve the utilization rate of the quantum dot material.

Fourth Embodiment

In the fourth embodiment, all the thermosensitive quantum dot material layers are coated together and then transferred onto corresponding subpixel regions respectively. FIGS. 5A-5G schematically illustrate in exemplary sectional views individual stages of the method for manufacturing a quantum dot light emitting diode subpixel array according to a fourth embodiment of the present disclosure.

Figure 5A:
Figure 5B:
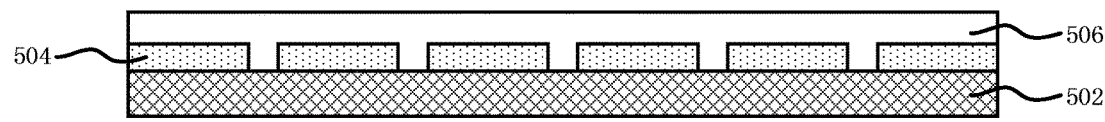

Similar to the first embodiment, as shown in FIGS. 5A and 5B, an optional TFT array 504 may be formed on a rinsed base substrate 502, and a quantum dot accepting layer 506 may be formed on the optional TFT array 504, which are same as the steps shown in FIGS. 2A and 2B in the first embodiment.

Figure 5C:
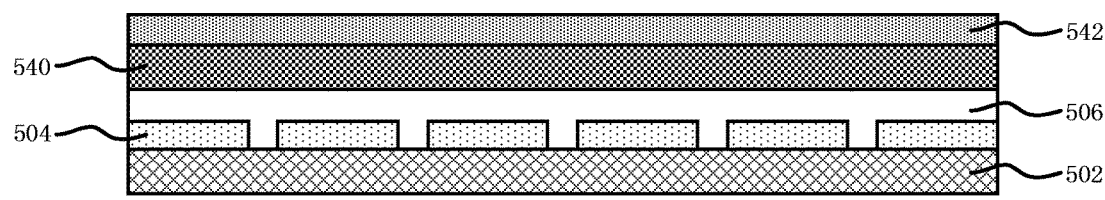

Then, as shown in FIG. 5C, a stack 540 of thermosensitive quantum dot material layers may be applied on a quantum dot accepting layer 506. In the present embodiment, the application of the stack 540 of thermosensitive quantum dot material layers is performed by placing a carrier substrate 542 with the stack 540 of thermosensitive quantum dot material layers provided thereon on the quantum dot accepting layer 506 such that the stack 540 of thermosensitive quantum dot material layers faces the quantum dot accepting layer 506. The stack 540 is formed by coating a third thermosensitive quantum dot material layer (not shown), a second thermosensitive quantum dot material layer (not shown) and a first thermosensitive quantum dot material layer (not shown) on a carrier substrate 542 sequentially. The first thermosensitive quantum dot material layer that is the layer farthest from the carrier substrate 542 (the layer adjacent to the quantum dot accepting layer 506) is a thermosensitive quantum dot material layer having the lowest phase transition temperature, and the third thermosensitive quantum dot material layer that is the layer nearest to the carrier substrate 542 is a thermosensitive quantum dot material layer having the highest phase transition temperature. Each quantum dot material of the stack 540 of thermosensitive quantum dot material layers comprises a thermosensitive organic ligand. The stack 540 of thermosensitive quantum dot material layers has excellent compatibility with the carrier substrate 542 and can adhere to the surface of the carrier substrate 542 tightly before being heated.

Specifically, if, as an example, the thermosensitive quantum dot material for green LED has the lowest phase transition temperature, the thermosensitive quantum dot material for red LED has the highest phase transition temperature, and the thermosensitive quantum dot material for blue LED has an intermediate phase transition temperature, the first thermosensitive quantum dot material layer (i.e., the layer farthest from the carrier substrate 542) comprises the thermosensitive quantum dot material for green LED, the third thermosensitive quantum dot material layer (i.e., the layer nearest to the carrier substrate 542) comprises the thermosensitive quantum dot material for red LED, and the intermediate second thermosensitive quantum dot material layer comprises the thermosensitive quantum dot material for blue LED. This is only an example and the embodiments of the present disclosure are not limited thereto.

Figure 5D:
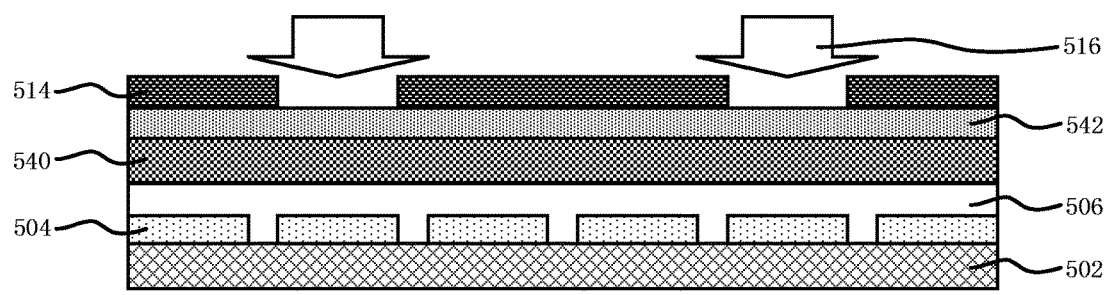

As shown in FIG. 5D, after the application of the stack 540 of thermosensitive quantum dot material layers, a first thermal conductive mask plate 514 may be placed on the carrier substrate 542 with the stack 540 of thermosensitive quantum dot material layers provided thereon such that a portion of the first thermal conductive mask plate 514 that is not covered by masking material is aligned with a first subpixel region onto which the first thermosensitive quantum dot material will be transferred in a subsequent heating process. Furthermore, the first thermal conductive mask plate 514 is heated by laser light 516 at a first temperature $T_1$, as shown in FIG. 5D. Thus, the organic ligand in the first thermosensitive quantum dot material in the area of the first thermosensitive quantum dot material layer that is not masked by the masking material is subjected to a chemical reaction and form weak bond with the surface functional group of the quantum dot accepting layer 506, such that the first thermosensitive quantum dot material in the area of the first thermosensitive quantum dot material layer that is not masked by the masking material is transferred onto the quantum dot accepting layer 506 and a portion of the second thermosensitive quantum dot material in this area is exposed.

Figure 5E:
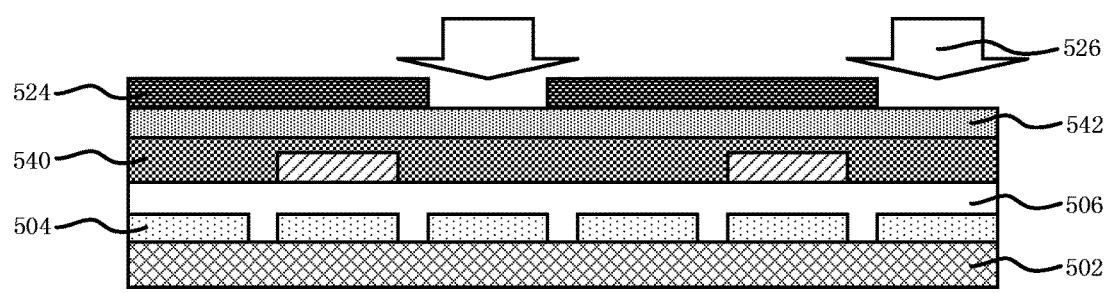

In this way, the first thermosensitive quantum dot material enters into its corresponding first subpixel region (in above specific example, the green subpixel region), as shown in FIG. 5E.

Next, as shown in FIG. 5E, the carrier substrate 542 may be moved by a distance of one subpixel unit such that an effective material area of the stack 540 in which the first thermosensitive quantum dot material has been transferred and the second thermosensitive quantum dot material has been exposed is aligned with a second subpixel region (in above specific example, the blue subpixel region). Furthermore, a second thermal conductive mask plate 514 may be placed on the carrier substrate 542 such that a portion of the second thermal conductive mask plate 514 that is not covered by masking material is aligned with a second subpixel region onto which the second thermosensitive quantum dot material will be transferred in a subsequent heating process. Then, the second thermal conductive mask plate 524 may be heated by laser light 526 at a second temperature $T_2$ ($T_2 > T_1$), as shown in FIG. 5E. Thus, the organic ligand in the second thermosensitive quantum dot material in an area of the second thermosensitive quantum dot material layer that is not masked by the masking material is subjected to a chemical reaction and form weak bond with the surface functional group of the quantum dot accepting layer 506, such that the second thermosensitive quantum dot material in this area of the second thermosensitive quantum dot material layer that is not masked by the masking material is transferred onto the quantum dot accepting layer 506 and the third thermosensitive quantum dot material in this area is exposed.

Figure 5F:
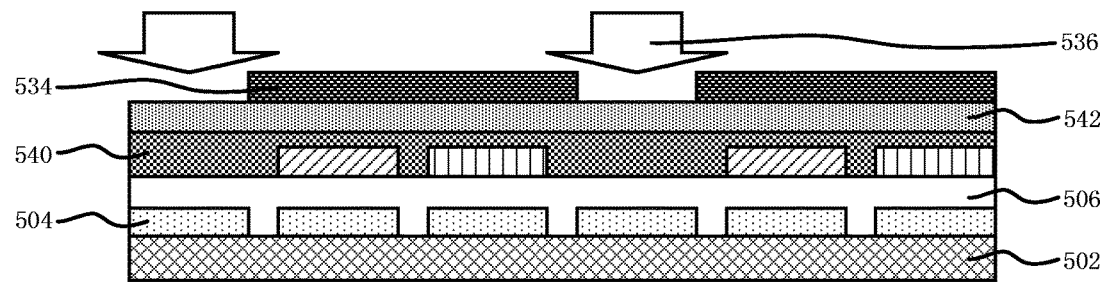

In this way, the second thermosensitive quantum dot material enters into its corresponding second subpixel region (in above specific example, the blue subpixel region), as shown in FIG. 5F.

Next, as shown in FIG. 5F, the carrier substrate 542 may again be moved by a distance of one subpixel unit such that an effective material area of the stack 540 in which the first and second thermosensitive quantum dot material have been transferred and the third thermosensitive quantum dot material has been exposed is aligned with a third subpixel region (in above specific example, the red subpixel region). Furthermore, a third thermal conductive mask plate 534 may be placed on the carrier substrate 542 such that a portion of the third thermal conductive mask plate 534 that is not covered by masking material is aligned with the third subpixel region onto which the third thermosensitive quantum dot material will be transferred in a subsequent heating process. Then, the third thermal conductive mask plate 534 may be heated by laser light 536 at a third temperature $T_3$ ($T_3 > T_2$), as shown in FIG. 5F. Thus, the organic ligand in the third thermosensitive quantum dot material in an area of the third thermosensitive quantum dot material layer that is not masked by the masking material is subjected to a chemical reaction and form weak bond with the surface functional group of the quantum dot accepting layer 506, such that the second thermosensitive quantum dot material in this area of the second thermosensitive quantum dot material layer that is not masked by the masking material is transferred onto the quantum dot accepting layer 506.

Figure 5G:
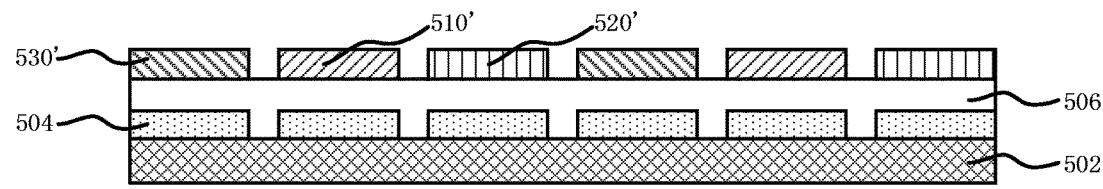

In this way, the third thermosensitive quantum dot material enters into its corresponding third subpixel region (in above specific example, the red subpixel region), as shown in FIG. 5G. Then, the remaining unreacted portion of the stack 540 of the thermosensitive quantum dot material layers may be removed together with the carrier substrate 542.

Thus an array of the first thermosensitive quantum dot material 510', an array of the second thermosensitive quantum dot material 520' and an array of the third thermosensitive quantum dot material 530' (in above specific example, may be a green subpixel array, a blue subpixel array and a red subpixel array, respectively) may be formed respectively in the first, second and third subpixel regions of the substrate by heating process.

Other steps and configurations after the formation of all the subpixel arrays in the present embodiment are same as those in the first embodiment and will not be repeated herein.

The resolution of the AM-QD-LED device thus manufactured may be improved dramatically. For example, the minimum area of a subpixel of the device may be 10-30 μm or less, and thus the resolution can be about 300-800 ppi or higher.

As described above, the fact of forming subpixels such as red, green and blue subpixels directly from thermosensitive quantum dot material by using heating process according to the manufacturing method of the present embodiment may facilitate the efficient production of high-resolution active matrix quantum dot light emitting diodes and the preparation in the process, improve the yield, and dramatically improve the utilization rate of the quantum dot material.

Fifth Embodiment

The fifth embodiment uses a method similar to that of the fourth embodiment in which all the thermosensitive quantum dot material layers are coated together and then transferred onto corresponding subpixel regions respectively so as to accomplish the transferring of the thermosensitive quantum dot material layers to their respective subpixel regions. The fifth embodiment is different from the fourth embodiment in that the stack of thermosensitive quantum dot material layers is carried on a thermal conductive mask rather than a carrier substrate, which is similar to the case in the second embodiment.

FIGS. 6A-6F schematically illustrate in exemplary sectional views individual stages of the method for manufacturing a quantum dot light emitting diode subpixel array according to a fifth embodiment of the present disclosure.

Figure 6A:
Figure 6B:
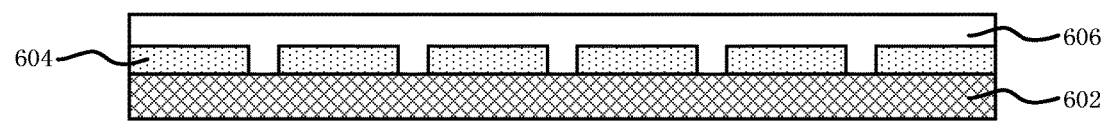

As shown in FIGS. 6A and 6B, an optional TFT array 604 may be formed on a rinsed base substrate 602, and a quantum dot accepting layer 606 may be formed on the optional TFT array 604, which are same as the steps shown in FIGS. 2A and 2B in the first embodiment.

Figure 6C:
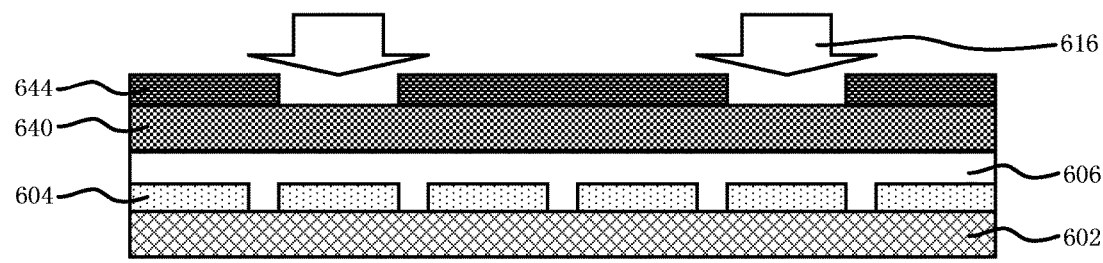

Then, as shown in FIG. 6C, a stack 640 of thermosensitive quantum dot material layers may be applied on a quantum dot accepting layer 506. In the present embodiment, the application of the stack 540 of thermosensitive quantum dot material layers is performed by placing a thermal conductive mask plate 644 with the stack 640 of thermosensitive quantum dot material layers provided thereon on the quantum dot accepting layer 606 such that the stack 640 of thermosensitive quantum dot material layers faces the quantum dot accepting layer 606 and a portion of the thermal conductive mask plate 644 that is not covered by masking material is aligned with a first subpixel region onto which a first thermosensitive quantum dot material will be transferred in a subsequent heating process. The stack 640 is formed by coating a third thermosensitive quantum dot material layer (not shown), a second thermosensitive quantum dot material layer (not shown) and a first thermosensitive quantum dot material layer (not shown) on the thermal conductive mask plate 644 sequentially. The first thermosensitive quantum dot material layer that is the layer farthest from the thermal conductive mask plate 644 (the layer adjacent to the quantum dot accepting layer 606) is a thermosensitive quantum dot material layer having the lowest phase transition temperature, and the third thermosensitive quantum dot material layer that is the layer nearest to the thermal conductive mask plate 644 is a thermosensitive quantum dot material layer having the highest phase transition temperature. Each quantum dot material of the stack 640 of thermosensitive quantum dot material layers comprises thermosensitive organic ligand. The stack 640 of thermosensitive quantum dot material layers has excellent compatibility with the thermal conductive mask plate 644 and can adhere to the surface of the thermal conductive mask plate 644 tightly before being heated.

Specifically, if, as an example, the thermosensitive quantum dot material for green LED has the lowest phase transition temperature, the thermosensitive quantum dot material for red LED has the highest phase transition temperature, and the thermosensitive quantum dot material for blue LED has an intermediate phase transition temperature, the first thermosensitive quantum dot material layer (i.e., the layer farthest from the thermal conductive mask plate 644) comprises the thermosensitive quantum dot material for green LED, the third thermosensitive quantum dot material layer (i.e., the layer nearest to the thermal conductive mask plate 644) comprises the thermosensitive quantum dot material for red LED, and the intermediate second thermosensitive quantum dot material layer comprises the thermosensitive quantum dot material for blue LED. This is only an example and the embodiments of the present disclosure are not limited thereto.

As shown in FIG. 6C, after applying the stack 640 of thermosensitive quantum dot material layers, the thermal conductive mask plate 644 may be heated by laser light 616 at a first temperature $T_1$. Thus, the organic ligand in the first thermosensitive quantum dot material in an area of the first thermosensitive quantum dot material layer that is not masked by the masking material is subjected to a chemical reaction and form weak bond with the surface functional group of the quantum dot accepting layer 606, such that the first thermosensitive quantum dot material in this area of the first thermosensitive quantum dot material layer that is not masked by the masking material is transferred onto the quantum dot accepting layer 606 and the second thermosensitive quantum dot material in this area is exposed.

Figure 6D:
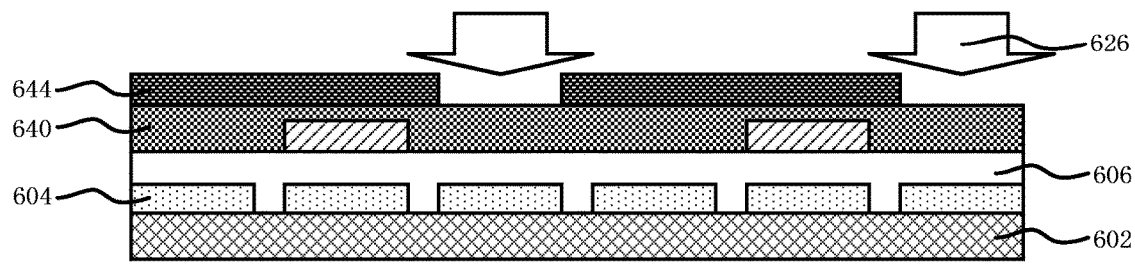

In this way, the first thermosensitive quantum dot material enters into its corresponding first subpixel region (in above specific example, the green subpixel region), as shown in FIG. 6D.

Next, as shown in FIG. 6D, the thermal conductive mask plate 644 may be moved by a distance of one subpixel unit such that an effective material area (the area is also corresponding to the portion of the thermal conductive mask plate 644 that is not covered by the masking material) of the stack 640 in which the first thermosensitive quantum dot material has been transferred and the second thermosensitive quantum dot material has been exposed is aligned with a second subpixel region (in above specific example, the blue subpixel region) onto which the second thermosensitive quantum dot material will be transferred in a subsequent heating process. Then, the thermal conductive mask plate 644 may be heated by laser light 626 at a second temperature $T_2$ ($T_2 > T_1$), as shown in FIG. 6D. Thus, the organic ligand in the second thermosensitive quantum dot material in the area that is not masked by the masking material is subjected to a chemical reaction and form weak bond with the surface functional group of the quantum dot accepting layer 606, such that the second thermosensitive quantum dot material in the area that is not masked by the masking material is transferred onto the quantum dot accepting layer 606 and the third thermosensitive quantum dot material in this area is exposed.

Figure 6E:
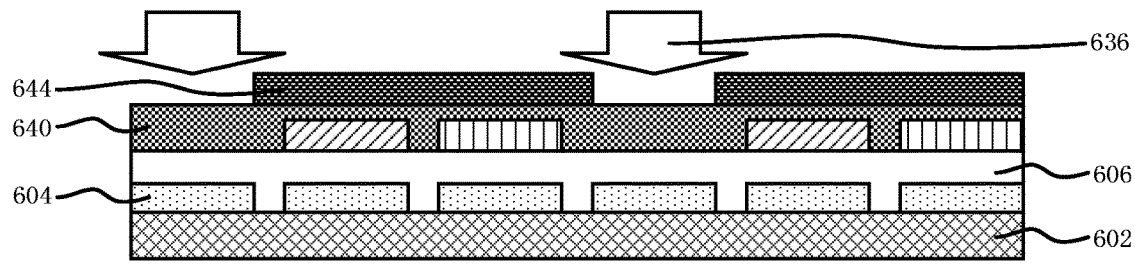

In this way, the second thermosensitive quantum dot material enters into its corresponding second subpixel region (in above specific example, the blue subpixel region), as shown in FIG. 6E.

Next, as shown in FIG. 6E, the thermal conductive mask plate 644 may be moved again by one subpixel unit such that an effective material area (the area also corresponds to the portion of the thermal conductive mask plate 644 that is not covered by masking material) of the stack 540 in which the first and second thermosensitive quantum dot material have been transferred and the third thermosensitive quantum dot material has been exposed is aligned with a third subpixel region (in above specific example, the red subpixel region) onto which the third thermosensitive quantum dot material will be transferred in a subsequent heating process. Then, the thermal conductive mask plate 644 may be heated by laser light 636 at a third temperature $T_3$ ($T_3 > T_2$), as shown in FIG. 6E. Thus, the organic ligand in the third thermosensitive quantum dot material of the third thermosensitive quantum dot material layer in an area that is not masked by the masking material is subjected to a chemical reaction and form weak bond with the surface functional group of the quantum dot accepting layer 606, such that the third thermosensitive quantum dot material of the third thermosensitive quantum dot material layer in this area that is not masked by the masking material is transferred onto the quantum dot accepting layer 606.

Figure 6F:
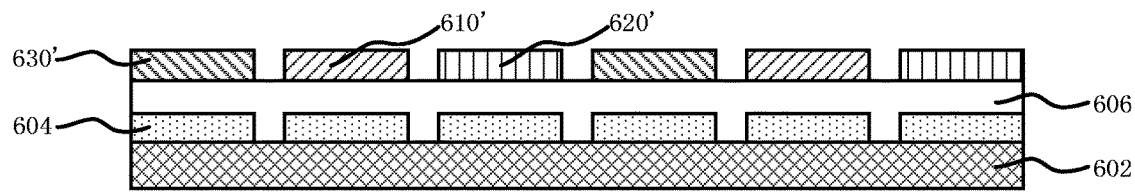

In this way, the third thermosensitive quantum dot material enters into its corresponding third subpixel region (in above specific example, the red subpixel region), as shown in FIG. 6F. Then, the remaining unreacted portion of the stack 640 of the quantum dot material may be removed together with the thermal conductive mask plate 644.

Therefore, an array of the first thermosensitive quantum dot material 610', an array of the second thermosensitive quantum dot material 620' and an array of the third thermosensitive quantum dot material 630' (in above specific example, may be a green subpixel array, a blue subpixel array and a red subpixel array, respectively) may be formed respectively in the first, second and third subpixel regions of the substrate by heating process.

Other steps and configurations after the formation of all the subpixel arrays in the present embodiment are same as those in the first embodiment and will not be repeated herein.

As described above, the fact of forming subpixels such as red, green and blue subpixels directly from thermosensitive quantum dot material by using heating process according to the manufacturing method of the present embodiment may facilitate the efficient production of high-resolution active matrix quantum dot light emitting diodes and the preparation in the process, improve the yield, and dramatically improve the utilization rate of the quantum dot material.

Furthermore, it is to be understood by one skilled in the art that the above embodiments are only illustrative rather than restrictive.

Although heating by laser light is taken as an example for the heating process in above embodiments of the present disclosure, the heating process may be any of the heating processes known in the art such as heating by infrared light source, heating by oven and etc. or a combination thereof. Furthermore, the manner of heating may comprise heating by using a thermal conductive mask plate, heating by periodically scanning, and heating as a whole and etc. Moreover, it will facilitate the completion of the process to heat the whole substrate while heating the quantum dot material so as to form a film thereof in a corresponding subpixel region. The precision of heating is high when heating is performed by laser light that has excellent collimation; while in case that heating is performed by using an oven or an infrared light source, the substantial difference in thermal conductivity between the portion of the thermal conductive mask plate that is not covered by masking material and the portion thereof that is covered by masking material may be used to achieve the object of bonding by heating.

In other words, the heating in the embodiments of the present disclosure comprises but is not limited to:

a) heating the thermosensitive quantum dot material layers by using laser light, an infrared light source, an oven or the like in combination with the thermal conductive mask plate having high thermal conductivity (for example, the first, second, fourth and fifth embodiments);

b) heating the thermosensitive quantum dot material layers by periodically scanning with laser light (for example, the third embodiment);

c) heating the substrate as a whole and heating the thermosensitive quantum dot material layers by periodically scanning with laser light;

d) heating the thermosensitive quantum dot material layers by heating the substrates made from different materials as a whole in combination with a thermal conductive mask plate having high thermal conductivity without using laser light; and e) other similar approach or approach that can be used in combination may be used to implement the process.

It shall be understood by one skilled in the art that the heating processes mentioned above may be exchanged or combined with each other. For example, in the first, second, fourth and fifth embodiments, the thermal conductive mask plate may be substituted by periodical scanning with laser light.

In an example of the above embodiments, the organic ligand in the thermosensitive quantum dot material layers may contain a group susceptible to thermal decomposition to produce amino group, hydroxyl group, carboxyl group or phenolic hydroxyl group (for example, hydroxyl group, amino group or phenolic hydroxyl group protected by tert-butyl ester (Boc)). When amino group, hydroxyl group, carboxyl group or phenolic hydroxyl group are produced, they will form weak bond, for example hydrogen bond, with the functional group such as amino group, pyridyl group, carboxyl group or hydroxyl group contained in the quantum dot accepting layer, and thus fall off from the carrier substrate or the thermal conductive mask plate and are transferred on to the quantum dot accepting layer. In addition to Boc, the protective group herein may also be Benzyl group, tri-methyl-silane or the like. Boc is more preferred to be taken as protective group because of its excellent thermosensitivity.

In exemplary embodiments of the present disclosure, the hole transport layer or the electron transport layer with certain functional group such as amino group, pyridyl group, carboxyl group or hydroxyl group may be used as the quantum dot accepting layer instead of an individual quantum dot accepting layer, so as to simplify the manufacturing process and the structure of the device.

As described above, in exemplary embodiments of the present disclosure, the thermosensitive quantum dot material contains thermosensitive organic ligand that will be subjected to a chemical reaction after being heated, and the transferring of the quantum dot material onto the backplane of the QD-LED can be achieved. In exemplary embodiments of the present disclosure, the way by which to achieve the transferring may comprise but is not limited to changes in affinity of the organic ligand to different materials:

1) the organic ligand in the thermosensitive quantum dot material in a predetermined area of the thermosensitive quantum dot material layer may be subjected to a reaction by being heated, so as to become not compatible with the carrier substrate or thermal conductive mask plate on which it is provided and with which it was compatible and to form weak bond with the quantum dot accepting layer. As an example, the combination of the materials for forming the carrier substrate or thermal conductive mask plate on which the quantum dot material is provided, the thermosensitive quantum dot material and the quantum dot accepting layer may be but not limited to one or more of the following combinations of materials:

a) the carrier substrate or thermal conductive mask plate on which the thermosensitive quantum dot material is provided is formed from oil soluble material; the organic ligand in the thermosensitive quantum dot material comprises hydroxyl group or phenolic hydroxyl group protected by tert-butyl ester (Boc); the quantum dot accepting layer is a polymer layer containing amino group or pyridyl group, such as polyaniline, polyvinylpyridine, polyvinylamine or the like.

b) the carrier substrate or thermal conductive mask plate on which the thermosensitive quantum dot material is provided is formed from oil soluble material; the organic ligand in the thermosensitive quantum dot material comprises amino group protected by tert-butyl ester (Boc); the quantum dot accepting layer is a polymer layer containing carboxyl group or hydroxyl group, such as polyacrylic acid, polyvinyl alcohol or the like.

c) the carrier substrate or thermal conductive mask plate on which the thermosensitive quantum dot material is provided is formed from oil soluble material; the organic ligand in the thermosensitive quantum dot material comprises hydroxyl group or phenolic hydroxyl group protected by tert-butyl ester (Boc); there is no individual quantum dot accepting layer, rather, the hole transport layer or electron transport layer between the quantum dot material and the substrate contains amino group or pyridyl group in its molecules and acts as the quantum dot accepting layer directly;

d) the carrier substrate or thermal conductive mask plate on which the thermosensitive quantum dot material is provided is formed from oil soluble material; the organic ligand in the thermosensitive quantum dot material comprises amino group protected by tert-butyl ester (Boc); there is no individual quantum dot accepting layer, rather, the hole transport layer or electron transport layer between the quantum dot material and the substrate contains carboxyl group or hydroxyl group in its molecules and acts as the quantum dot accepting layer directly.

2) The organic ligand in the thermosensitive quantum dot material layer may react chemically with the quantum dot accepting layer (or the hole transport layer or the electron transport layer acting as the quantum dot accepting layer) in case of being heated so as to form chemical bonds, and thus bond with the quantum dot accepting layer (or the hole transport layer or the electron transport layer acting as the quantum dot accepting layer). The organic ligand of the thermosensitive quantum dot material and the quantum dot accepting layer (or the hole transport layer or the electron transport layer acting as the quantum dot accepting layer) may be but not limited to: the organic ligand of the thermosensitive quantum dot material may contain 1, 3-butadienyl, the molecules of the quantum dot accepting layer (or the hole transport layer or the electron transport layer acting as the quantum dot accepting layer) may contain alkenyl group; alternatively, the organic ligand of the thermosensitive quantum dot material may contain alkenyl group, the molecules of the quantum dot accepting layer (or the hole transport layer or the electron transport layer acting as the quantum dot accepting layer) may contain 1, 3-butadienyl.

It is to be noted that the carrier substrate or the thermal conductive mask plate used for carrying the thermosensitive quantum dot material is not necessary. For example, in the third embodiment, the thermosensitive quantum dot material is coated directly on the quantum dot accepting layer instead of providing the thermosensitive quantum dot material on the carrier substrate or the thermal conductive mask plate.

In the above first to third embodiments, three kinds of thermosensitive quantum dot material for emitting three colors of light respectively are used to form subpixels individually; while in the fourth and fifth embodiments, three kinds of thermosensitive quantum dot material for emitting three colors of light respectively are coated together but are heated by laser light individually so as to form subpixels. One skilled in the art may conceive of other processes similar to those described above or a combination thereof to form the subpixels layout.

Furthermore, although a AM-QD-LED display device comprising three color subpixel arrays of thermosensitive quantum dot material layers such as green, blue and red light emitting layers respectively (pixel layout of RGB) is described in the above embodiments, the embodiments of the present disclosure do not limit the number of the colors of the quantum dot light emitting diode subpixel arrays or the sequence for forming them. The thermosensitive quantum dot material layers may be the layers of the thermosensitive quantum dot materials for pixel layout of single color, two colors, three colors or more colors, for example, may be the layers of the thermosensitive quantum dot materials for respective subpixel regions of RGB pixel layout or RGBW pixel layout, or may be the layers of the thermosensitive quantum dot materials for respective subpixel regions with different subpixel areas in RGB pixel layout or RGBW pixel layout. For example, a problem that light emitting efficiency may be different for respective subpixel regions may exist in RGB or RGBW pixel layout. To overcome the problem, the light emitting area of a subpixel region with high light emitting efficiency may be reduced to decrease the luminance of that subpixel region and/or the light emitting area of a subpixel region with low light emitting efficiency may be increased to increase the luminance of that subpixel region, so as to achieve better white balance. Furthermore, the sequence for forming respective subpixel regions is not limited to an order of green, blue and red as described above, and may be any forming sequence.

Although it is described that all subpixel regions of the quantum dot light emitting diode are formed from thermosensitive quantum dot material, the embodiments of the present disclosure are not limited thereto. For example, at least one of the subpixel regions of the quantum dot light emitting diode may be formed from thermosensitive quantum dot material, and the remaining subpixel regions may be formed from organic light emitting material.

There is no special limitation to the preparation of the optional TFT in the embodiments of the present disclosure. For example, the preparation not only can be used for TFTs in which the active layer comprises indium gallium zinc oxide (IGZO), amorphous silicon (a-Si), low-temperature poly-silicon (LTPS) or the like, but also can be used for other types of TFT.

There is no limitation to the structure of the QD-LED device in the embodiments of the present disclosure. For example, the structure is not limited to a normal structure in which the anode is located at the bottom (the substrate side) and the cathode is located at the top, an inverted structure in which the cathode is located at the bottom (the substrate side) and the anode is located at the top, or the like. There is also no limitation to the light emitting direction in the embodiments of the present disclosure, and for example, light may be emitted from the bottom or from the top.

The phase "weak bond" in the description mainly means hydrogen bond, van der Waals force, salt bond, halogen bond or the like. The hydrogen bond is preferred to be the weak bond between the quantum dot material and the quantum dot accepting layer because of its relatively stronger bonding force. However, it shall be understood by one skilled in the art that other weak bond may also be used to bond the thermosensitive quantum dot material with the quantum dot accepting layer.

A lot of details have been described in the description of the present disclosure. However, it shall be understood that the embodiments of the present disclosure may be practiced without these details. In some embodiments, well known processes, structures and technologies are not illustrated in detail so as to not obscure the understanding to the present disclosure.

At the end, it shall be noted that the above embodiments are only used to describe the technical solution of the present disclosure rather than a limitation thereto. Although the present disclosure has been described in detail in reference to above embodiments, it shall be understood by one of ordinary skill in the art that various modification or combination may be made to the technical solution described in above embodiments or equivalent substitution may be made to some technical features thereof without departing from the spirit or scope of technical solutions of the embodiments.

The invention claimed is:

1. A method for manufacturing a quantum dot light emitting diode subpixel array, the method comprising:
   forming a quantum dot accepting layer on a substrate, the quantum dot accepting layer including a surface functional group;
   applying a thermosensitive quantum dot material layer including a thermosensitive organic ligand on the quantum dot accepting layer; and
   transferring thermosensitive quantum dot material by subjecting the organic ligand of the thermosensitive quantum dot material in a predetermined area of the thermosensitive quantum dot material layer to a chemical reaction with the surface functional group of the quantum dot accepting layer by heating to form a weak-force bond, where the thermosensitive quantum dot material in the predetermined area is transferred onto a corresponding subpixel region on the quantum dot accepting layer.

2. The method according to claim 1, further comprising, after transferring the thermosensitive quantum dot material, removing unreacted thermosensitive quantum dot material remaining in the thermosensitive quantum dot material layer.

3. The method according to claim 1, wherein applying the thermosensitive quantum dot material layer comprises placing a carrier substrate with the thermosensitive quantum dot material layer formed thereon on the quantum dot accepting layer in an alignment position, with the thermosensitive quantum dot material layer facing the quantum dot accepting layer.

4. The method according to claim 3, further comprising, after transferring the thermosensitive quantum dot material, removing the carrier substrate.

5. The method according to claim 1, wherein applying the thermosensitive quantum dot material layer comprises placing a thermal conductive mask plate with the thermosensitive quantum dot material layer formed thereon on the quantum dot accepting layer in an alignment position, with the thermosensitive quantum dot material layer facing the quantum dot accepting layer.

6. The method according to claim 5, further comprising, after transferring the thermosensitive quantum dot material, removing the thermal conductive mask plate.

7. The method according to claim 1, wherein applying the thermosensitive quantum dot material layer comprises coating the thermosensitive quantum dot material layer on the quantum dot accepting layer.

8. The method according to claim 7, further comprising, after transferring the thermosensitive quantum dot material, washing away unreacted thermosensitive quantum dot material remaining in the thermosensitive quantum dot material layer using a rinsing process.

9. The method according to claim 1, wherein heating comprises one or more of heating by a laser light, heating by an infrared light source or heating by an oven.

10. The method according to claim 1, wherein heating comprises periodically scanning the thermosensitive quantum dot material layer using laser light.

11. The method according to claim 1, wherein the quantum dot accepting layer comprises a hole transport layer or an electron transport layer positioned between the thermosensitive quantum dot material layer and the substrate.

12. The method according to claim 1, wherein the organic ligand in the thermosensitive quantum dot material layer comprises a group susceptible to thermal decomposition to produce an amino group, a hydroxyl group, a carboxyl group or a phenolic hydroxyl group.

13. The method according to claim 1, wherein the quantum dot accepting layer is a polymer layer containing an amino group, a pyridyl group, a carboxyl group or a hydroxyl group.

14. The method according to claim 5, wherein the thermal conductive mask plate is formed from oil soluble material.

15. The method according to claim 3, wherein the carrier substrate for the thermosensitive quantum dot material layer is formed from oil soluble material.

16. The method according to claim 1, wherein,
after forming the quantum dot accepting layer, applying the thermosensitive quantum dot material layer and transferring the thermosensitive quantum dot material are repeated for each thermosensitive quantum dot material of two or more thermosensitive quantum dot materials to form the two or more thermosensitive quantum dot materials on respective subpixel regions.

17. The method according to claim 3, wherein the thermosensitive quantum dot material layer formed on the carrier substrate is a stack of two or more thermosensitive quantum dot material layers, a first layer in the stack that is farthest from the carrier substrate is a thermosensitive quantum dot material layer having the lowest phase transition temperature of the two or more thermosensitive quantum dot material layers, a layer in the stack that is nearest to the carrier substrate is a thermosensitive quantum dot material layer having the highest phase transition temperature of the two or more thermosensitive quantum dot material layers, and transferring the thermosensitive quantum dot material comprises:
heating the predetermined area of the stack at a first temperature to transfer a portion of the first layer in the stack that is in the predetermined area onto a first subpixel region on the quantum dot accepting layer and to expose a portion of a second layer adjacent to the first layer in the stack that is in the predetermined area;
moving the carrier substrate by a distance of one subpixel unit to align the exposed portion of the second layer in the stack that is in the predetermined area with a second subpixel region, and heating the predetermined area at a second temperature higher than the first temperature to transfer the exposed portion of the second layer onto a second subpixel region on the quantum dot accepting layer; and
transferring all layers in the stack in the predetermined area onto respective subpixel regions on the quantum dot accepting layer using gradually increased temperatures.

18. The method according to claim 5, wherein the thermosensitive quantum dot material layer formed on the thermal conductive mask plate is a stack of two or more thermosensitive quantum dot material layers, a first layer in the stack that is farthest from the thermal conductive mask plate is a thermosensitive quantum dot material layer having the lowest phase transition temperature of the two or more thermosensitive quantum dot material layers, a layer in the stack that is nearest to the thermal conductive mask plate is a thermosensitive quantum dot material layer having the highest phase transition temperature of the two or more thermosensitive quantum dot material layers, and transferring the thermosensitive quantum dot material comprises:
heating the predetermined area of the stack at a first temperature to transfer a portion of the first layer in the stack that is in the predetermined area onto a first subpixel region on the quantum dot accepting layer and to expose a portion of a second layer adjacent to the first layer in the stack that is in the predetermined area;
moving the thermal conductive mask plate by a distance of one subpixel unit to align the exposed portion of the second layer in the stack that is in the predetermined area with a second subpixel region, and heating the predetermined area at a second temperature higher than the first temperature to transfer the exposed portion of the second layer onto a second subpixel region on the quantum dot accepting layer; and
transferring all layers in the stack in the predetermined area onto respective subpixel regions on the quantum dot accepting layer using gradually increased temperatures.

19. A method for manufacturing a quantum dot light emitting diode subpixel array, the method comprising:
forming a quantum dot accepting layer on a substrate;
applying a thermosensitive quantum dot material layer including a thermosensitive organic ligand on the quantum dot accepting layer, by placing a thermal conductive mask plate with the thermosensitive quantum dot material layer formed thereon on the quantum dot accepting layer in an alignment position, with the thermosensitive quantum dot material layer facing the quantum dot accepting layer; and
transferring a thermosensitive quantum dot material by subjecting the organic ligand of thermosensitive quantum dot material in a predetermined area of the thermosensitive quantum dot material layer to a chemical reaction by heating to transfer the thermosensitive quantum dot material in the predetermined area onto a corresponding subpixel region on the quantum dot accepting layer.

20. A method for manufacturing a quantum dot light emitting diode subpixel array, the method comprising:
forming a quantum dot accepting layer on a substrate;
applying a thermosensitive quantum dot material layer including a thermosensitive organic ligand on the quantum dot accepting layer, by placing a carrier substrate with the thermosensitive quantum dot material layer formed thereon on the quantum dot accepting layer in an alignment position, with the thermosensitive quantum dot material layer facing the quantum dot accepting layer, wherein the carrier substrate for the thermosensitive quantum dot material layer is formed from oil soluble material; and
transferring a thermosensitive quantum dot material by subjecting the organic ligand of thermosensitive quantum dot material in a predetermined area of the thermosensitive quantum dot material layer to a chemical reaction by heating to transfer the thermosensitive quantum dot material in the predetermined area onto a corresponding subpixel region on the quantum dot accepting layer.

\* \* \* \* \*